US010243083B2

(12) United States Patent
Uchida et al.

(10) Patent No.: US 10,243,083 B2
(45) Date of Patent: Mar. 26, 2019

(54) SEMICONDUCTOR DEVICE AND METHOD FOR MANUFACTURING SEMICONDUCTOR DEVICE

(71) Applicant: Sharp Kabushiki Kaisha, Sakai, Osaka (JP)

(72) Inventors: Seiichi Uchida, Sakai (JP); Kuniaki Okada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/778,270

(22) PCT Filed: Nov. 14, 2016

(86) PCT No.: PCT/JP2016/083688
§ 371 (c)(1),
(2) Date: May 23, 2018

(87) PCT Pub. No.: WO2017/090477
PCT Pub. Date: Jun. 1, 2017

(65) Prior Publication Data
US 2018/0358469 A1    Dec. 13, 2018

(30) Foreign Application Priority Data

Nov. 24, 2015  (JP) ................................. 2015-228616

(51) Int. Cl.
*H01L 29/66* (2006.01)
*H01L 29/786* (2006.01)
(Continued)

(52) U.S. Cl.
CPC ........ *H01L 29/7869* (2013.01); *G02F 1/1343* (2013.01); *G02F 1/1368* (2013.01);
(Continued)

(58) Field of Classification Search
CPC .. H01L 21/28; H01L 27/1225; H01L 29/7869
See application file for complete search history.

(56) References Cited

U.S. PATENT DOCUMENTS 6,124,153 A * 9/2000 Lee .................... H01L 29/42364
148/DIG. 163
2008/0283828 A1* 11/2008 Lee ....................... C08G 61/122
257/40
(Continued)

FOREIGN PATENT DOCUMENTS

JP    2012-134475 A    7/2012
JP    2013-105136 A    5/2013
(Continued)

*Primary Examiner* — Thao P Le
(74) *Attorney, Agent, or Firm* — Keating & Bennett, LLP

(57) ABSTRACT

A semiconductor device (1001) includes: a thin film transistor (101) including an oxide semiconductor layer (16) including a channel region, and a source contact region and a drain contact region arranged on opposite sides of the channel region; an insulating layer arranged so as to cover the oxide semiconductor layer (16), the insulating layer having a contact hole (CH) through which the drain contact region is exposed; and a transparent electrode (24) to be in contact with the drain contact region in the contact hole (CH), wherein: as seen from a direction normal to the substrate, at least a part R of the drain contact region overlaps a gate electrode (12); and on an arbitrary cross section that extends in a channel width direction across the at least part (R) of the drain contact region, a width of the oxide semiconductor layer (16) is greater than a width of the gate electrode (12), and the gate electrode (12) is covered by the oxide semiconductor layer (16) with the gate insulating layer therebetween.

19 Claims, 11 Drawing Sheets

(51) Int. Cl.

| | |
|---|---|
| *G02F 1/1343* | (2006.01) |
| *G02F 1/1368* | (2006.01) |
| *G09F 9/30* | (2006.01) |
| *H01L 21/28* | (2006.01) |
| *H01L 29/41* | (2006.01) |
| *G02F 1/1362* | (2006.01) |
| *H01L 27/12* | (2006.01) |
| *H01L 29/24* | (2006.01) |

(52) U.S. Cl.
CPC .......... *G02F 1/136286* (2013.01); *G09F 9/30* (2013.01); *H01L 21/28* (2013.01); *H01L 27/127* (2013.01); *H01L 27/1225* (2013.01); *H01L 27/1244* (2013.01); *H01L 27/1255* (2013.01); *H01L 29/24* (2013.01); *H01L 29/41* (2013.01); *H01L 29/66969* (2013.01); *H01L 29/786* (2013.01); *H01L 29/78618* (2013.01); *H01L 29/78696* (2013.01); *G02F 2201/40* (2013.01)

(56) References Cited

U.S. PATENT DOCUMENTS

| | | | |
|---|---|---|---|
| 2011/0031496 A1* | 2/2011 | Yamazaki | H01L 27/1225 257/59 |
| 2012/0138922 A1 | 6/2012 | Yamazaki et al. | |
| 2013/0201420 A1 | 8/2013 | Misaki | |
| 2013/0207113 A1* | 8/2013 | Tsai | H01L 27/1225 257/59 |
| 2013/0320334 A1 | 12/2013 | Yamazaki et al. | |
| 2014/0286076 A1 | 9/2014 | Aoki et al. | |
| 2015/0206977 A1* | 7/2015 | Katoh | H01L 29/41733 327/109 |
| 2015/0270290 A1* | 9/2015 | Wei | H01L 29/7869 257/43 |

FOREIGN PATENT DOCUMENTS

| | | |
|---|---|---|
| JP | 5330603 B2 | 10/2013 |
| JP | 2014-007399 A | 1/2014 |
| JP | 2014-209727 A | 11/2014 |

\* cited by examiner (a)

(b)

(a)

(b)

(a)

(b)

(a)

(b)

(a)

(b)

SEMICONDUCTOR DEVICE AND METHOD FOR MANUFACTURING SEMICONDUCTOR DEVICE

TECHNICAL FIELD

The present invention relates to a semiconductor device having a thin film transistor (TFT), a display device, and a method for manufacturing a semiconductor device.

BACKGROUND ART

Display devices having an active matrix substrate on which a switching element is provided for each pixel have been widely used. An active matrix substrate including thin film transistors (hereinafter "TFTs") as switching elements is referred to as a TFT substrate. Note that in the present specification, a portion of a TFT substrate that corresponds to a pixel of a display device may also be referred to as a pixel.

In recent years, it has been proposed to use an oxide semiconductor as the material of the active layer of a TFT, instead of an amorphous silicon or a polycrystalline silicon. Such a TFT is referred to as an "oxide semiconductor TFT". An oxide semiconductor has a higher mobility than an amorphous silicon. Therefore, an oxide semiconductor TFT is capable of operating faster than an amorphous silicon TFT. Since an oxide semiconductor film is formed by a simpler process than a polycrystalline silicon film, it is applicable to a device that is required to have a large area.

Typically, a TFT substrate using an oxide semiconductor TFT includes, for each pixel, an oxide semiconductor TFT (hereinafter referred to simply as a "TFT".) supported on a substrate, and a pixel electrode electrically connected to the drain electrode (drain metal) of the TFT. The TFT is normally covered by an interlayer insulating layer. The pixel electrode is provided on the interlayer insulating layer, and is connected to the drain electrode of the TFT in a contact hole formed in the interlayer insulating layer. The configuration of such a TFT substrate is disclosed in Patent Document No. 1, for example.

With the configuration disclosed in Patent Document No. 1, a drain electrode (typically, a metal electrode) having a pattern that is slightly larger than the bottom surface of a pixel contact hole is arranged in a pixel. This presents a factor for lowering the ratio of the light-transmitting region with respect to the pixel (hereinafter "pixel aperture ratio"). Although the source bus line and the drain electrode are typically formed by patterning the same metal film, as the definition of a display device increases and the area of each pixel decreases, the interval between the source bus line and the drain electrode decreases, thus making processing more difficult.

On the other hand, a configuration in which the pixel electrode is arranged so as to be in direct contact with the oxide semiconductor layer of the TFT is proposed in Patent Document No. 2 by the same applicant. FIGS. 13(a) and 13(b) are a plan view and a cross-sectional view, respectively, illustrating a TFT substrate 2000 disclosed in FIG. 3 and FIG. 4 of Patent Document No. 2. The TFT substrate 2000 includes a substrate 921, a TFT supported on the substrate 921, an interlayer insulating layer (flattening film) 926 covering the TFT, and a pixel electrode 928. The TFT includes a gate electrode 922, a gate insulating layer 923, an oxide semiconductor layer 924, and a source electrode 925s. The source electrode 925s is formed from a metal film having a layered structure, and is arranged so as to be in contact with the upper surface of the oxide semiconductor layer 924. The pixel electrode 928 is provided on the interlayer insulating layer 926 and in a contact hole 927 formed in the interlayer insulating layer 926, and is in direct contact with the oxide semiconductor layer 924 in the contact hole 927. That is, a part of the pixel electrode 928 functions as the drain electrode.

In the present specification, a portion of the oxide semiconductor layer 924 that is in contact with the pixel electrode 928 is referred to as a drain contact region 924ad, and a portion thereof that is in contact with the source electrode 925s as a source contact region. A channel region 924ac of the oxide semiconductor layer 924 refers to a portion that is located between the source contact region and the drain contact region 924ad and that overlaps the gate electrode 922 with the gate insulating layer 923 therebetween. A connecting portion that directly connects together the pixel electrode 928 and the oxide semiconductor layer 924 is referred to as a "pixel contact portion", and the contact hole 927 formed in the interlayer insulating layer 926 for connecting together the pixel electrode 928 and the oxide semiconductor layer 924 as a "pixel contact hole". The plan view of FIG. 13(a) shows the bottom surface of the pixel contact hole 927 (i.e., the base surface exposed by the pixel contact hole).

CITATION LIST

Patent Literature

Patent Document No. 1: Japanese Laid-Open Patent Publication No. 2013-105136
Patent Document No. 2: Japanese Patent No. 5330603

SUMMARY OF INVENTION

Technical Problem

With the configuration disclosed in Patent Document No. 2, since there is no drain electrode that is formed by using the same metal film as the source bus line, it is possible to prevent the decrease in the pixel aperture ratio. This eliminates process restrictions and enables the formation of more minute pixels.

However, the present inventor found that with the TFT substrate 2000 disclosed in Patent Document No. 2, if the pixel contact hole 927 is misaligned, the pixel electrode 928 may possibly contact the gate electrode 922, thereby lowering the reliability. Details of this will be described later.

Thus, with the conventional semiconductor device, it is difficult to further increase the definition while ensuring a high reliability.

Embodiments of the present invention have been made in view of the above, and an object thereof is to provide a semiconductor device with which it is possible to realize a higher definition while ensuring a high reliability.

Solution to Problem

A semiconductor device according to an embodiment of the present invention is a semiconductor device including a substrate and a thin film transistor supported on the substrate, the thin film transistor including: a gate electrode; a gate insulating layer covering the gate electrode; an oxide semiconductor layer arranged on the gate insulating layer so as to partially overlap the gate electrode with the gate insulating layer therebetween, the oxide semiconductor layer including a channel region, and a source contact region and a drain contact region arranged on opposite sides of the channel region; and a source electrode in contact with the source contact region of the oxide semiconductor layer, the semiconductor device further including: an insulating layer arranged so as to cover the oxide semiconductor layer, the insulating layer having a contact hole through which the drain contact region of the oxide semiconductor layer is exposed; and a transparent electrode formed on the insulating layer and in the contact hole so as to be in contact with the drain contact region in the contact hole, wherein: as seen from a direction normal to the substrate, at least a part of the drain contact region overlaps the gate electrode; and on an arbitrary cross section that extends in a channel width direction of the thin film transistor across the at least part of the drain contact region, a width of the oxide semiconductor layer is greater than a width of the gate electrode, and the gate electrode is covered by the oxide semiconductor layer with the gate insulating layer therebetween.

In one embodiment, the semiconductor device further includes: a plurality of pixels arranged on the substrate in a matrix pattern extending in a first direction and in a second direction, a plurality of gate lines extending in the first direction, and a plurality of source lines extending in the second direction, wherein: the thin film transistor and the transparent electrode are arranged for each of the plurality of pixels; and the gate electrode is connected to one of the plurality of gate lines, and the source electrode is connected to one of the plurality of source lines.

In one embodiment, the source contact region, the channel region and the drain contact region are arranged next to each other in the second direction.

In one embodiment, as seen from the direction normal to the substrate, each of the plurality of gate lines includes a gate line main portion extending in the first direction, and a gate line branch portion extending in the second direction from the gate line main portion; and as seen from the direction normal to the substrate, at least a part of the gate line branch portion overlaps the drain contact region.

In one embodiment, as seen from the direction normal to the substrate, the gate line branch portion includes a first portion that overlaps the drain contact region and a second portion located between the first portion and the gate line main portion, and a maximum width of the first portion in the channel width direction is smaller than a maximum width of the second portion in the channel width direction.

In one embodiment, a width of the gate line branch portion in the channel width direction gradually decreases away from the gate line main portion.

In one embodiment, as seen from the direction normal to the substrate, the oxide semiconductor layer is arranged so as to cover the gate line branch portion and extend across the gate line main portion.

In one embodiment, as seen from the direction normal to the substrate, each of the plurality of source lines includes a source line main portion extending in the second direction and a source line branch portion extending in the first direction from the source line main portion, and at least a part of the source line branch portion is in contact with the source contact region.

In one embodiment, the semiconductor device further includes a dielectric layer formed on the transparent electrode and another transparent electrode formed on the dielectric layer.

In one embodiment, the semiconductor device further includes another transparent electrode arranged on a substrate side of the transparent electrode and a dielectric layer arranged between the other transparent electrode and the transparent electrode.

In one embodiment, the thin film transistor has a channel-etch structure.

In one embodiment, the oxide semiconductor layer includes an In—Ga—Zn—O-based oxide.

In one embodiment, the In—Ga—Zn—O-based oxide includes a crystalline portion.

In one embodiment, the oxide semiconductor layer has a layered structure.

A method for manufacturing a semiconductor device according to an embodiment of the present invention is a method for manufacturing a semiconductor device including a thin film transistor, the method including the steps of: (a) forming a gate electrode on the substrate; (b) forming a gate insulating layer covering the gate electrode; (c) forming an oxide semiconductor film on the gate insulating layer and patterning the oxide semiconductor film, thereby obtaining an island-shaped oxide semiconductor layer that overlaps the gate electrode with the gate insulating layer therebetween; (d) forming a source electrode in contact with the oxide semiconductor layer, a region of the oxide semiconductor layer that is in contact with the source electrode being a source contact region; (e) forming an insulating layer covering the oxide semiconductor layer; (f) forming a contact hole in the insulating layer through which a part of the oxide semiconductor layer is exposed; and (g) forming a transparent electrode on the insulating layer and in the contact hole so as to be in direct contact with the part of the oxide semiconductor layer in the contact hole, the part of the oxide semiconductor layer being a drain contact region, and a region of the oxide semiconductor layer that is located between the drain contact region and the source contact region serving as a channel region, wherein: as seen from a direction normal to the substrate, at least a part of the drain contact region of the oxide semiconductor layer overlaps the gate electrode; and on an arbitrary cross section that extends in a channel width direction of the thin film transistor across the at least part of the drain contact region, a width of the oxide semiconductor layer is greater than a width of the gate electrode, and the gate electrode is covered by the oxide semiconductor layer with the gate insulating layer therebetween.

In one embodiment, the thin film transistor has a channel-etch structure.

In one embodiment, the oxide semiconductor layer includes an In—Ga—Zn—O-based oxide.

In one embodiment, the In—Ga—Zn—O-based oxide includes a crystalline portion.

In one embodiment, the oxide semiconductor layer has a layered structure.

Advantageous Effects of Invention

According to an embodiment of the present invention, it is possible to provide a semiconductor device with which it is possible to realize a higher definition while ensuring a high reliability.

DESCRIPTION OF EMBODIMENTS (First Embodiment)

A semiconductor device according to an embodiment of the present invention will now be described with reference to the drawings. The semiconductor device of the present embodiment may be any device that includes a thin film transistor on a substrate, and it widely includes various circuit boards, TFT substrates, and display devices having TFT substrates. Herein, a TFT substrate will be described as an example. For example, the TFT substrate of the present embodiment can be used in display devices such as liquid crystal display devices, electrophoretic display devices, MEMS (Micro Electro Mechanical System) display devices, organic EL (Electroluminescence) display devices, etc.

Figure 1:
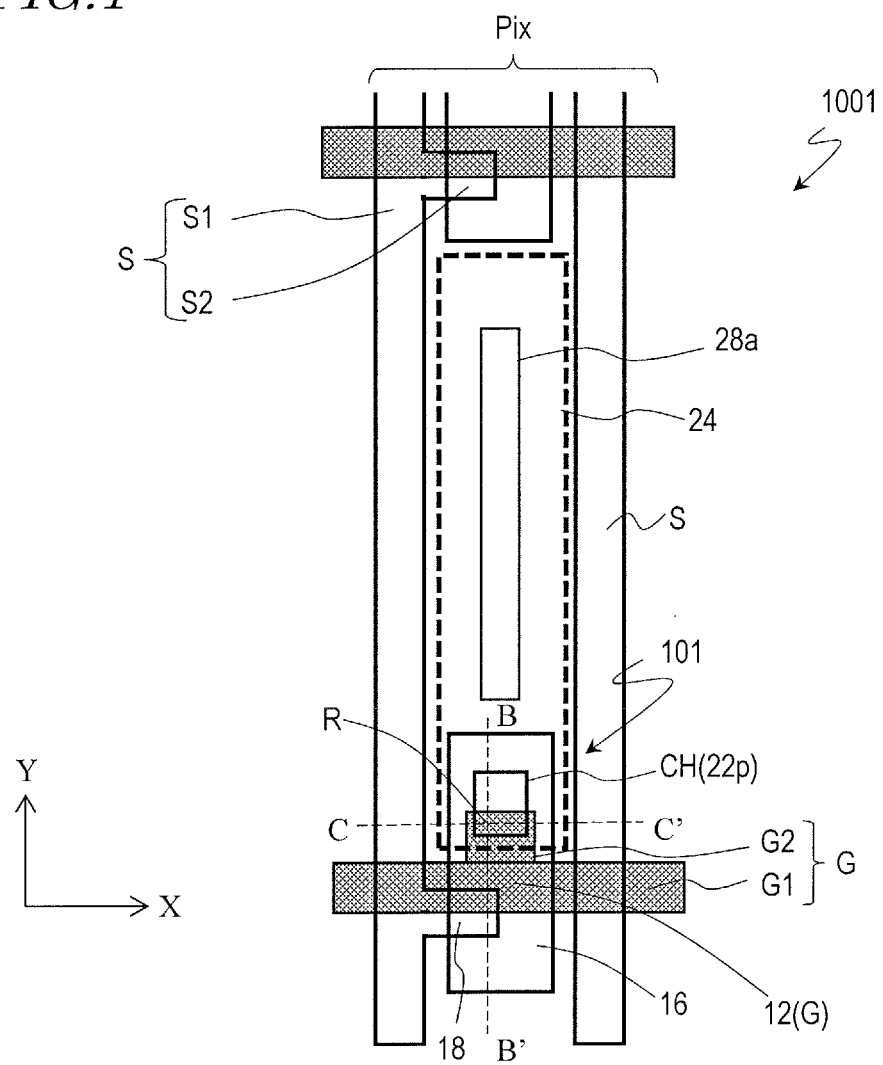
FIG. 1 A schematic plan view showing a semiconductor device 1001 of the first embodiment.

FIG. 1 is a schematic plan view showing a semiconductor device 1001 according to the first embodiment of the present invention, and FIGS. 2(a) and 2(b) are schematic cross-sectional views showing the semiconductor device 1001 taken along line B-B' and line C-C', respectively, shown in FIG. 1.

The semiconductor device 1001 includes a substrate 11, and a plurality of source lines S and a plurality of gate lines G formed on the substrate 11. The source lines S extend in the Y direction (referred to also as the "column direction" or the "second direction".), and the gate lines G extend in the X direction (referred to also as the "row direction" or "the first direction".) different from the Y direction. The semiconductor device 1001 includes a plurality of pixel regions Pix arranged in a matrix pattern extending in the row direction and in the column direction. The pixel regions Pix correspond to pixels of the liquid crystal display device. The row direction and the column direction may be perpendicular to each other. Note that a region of the semiconductor device 1001 that includes the plurality of pixel regions Pix is referred to as the "display region", and a region thereof that is other than the display region as the "non-display region" or the "bezel region". Terminal sections, driver circuits, etc., may be provided in the non-display region.

Each pixel region Pix includes an oxide semiconductor TFT (hereinafter simply as a "TFT") 101 supported on the substrate 11, an interlayer insulating layer 22 covering the TFT 101, and a pixel electrode 24. A common electrode 28 may further be provided on the pixel electrode 24 with a dielectric layer 26 therebetween. The pixel electrode 24 and the common electrode 28 are each a transparent electrode formed from a conductive film that can allow visible light to pass therethrough (that is light-transmissive).

The TFT 101 is a bottom gate TFT having a top-contact structure, for example. The TFT 101 includes a gate electrode 12, a gate insulating layer 14 covering the gate electrode 12, an oxide semiconductor layer 16 arranged on the gate insulating layer 14, and a source electrode 18 that is in contact with a part of the oxide semiconductor layer 16. The gate electrode 12 is connected to the corresponding gate line G, and the source electrode 18 is connected to the corresponding source line S. The oxide semiconductor layer 16 is arranged so as to partially overlap the gate electrode 12 with the gate insulating layer 14 therebetween.

The pixel electrode 24 is divided into pieces corresponding to pixels, and each piece is electrically connected to the corresponding TFT 101. For example, the pixel electrode 24 is arranged on the oxide semiconductor layer 16 with an insulating layer including the interlayer insulating layer 22 therebetween, and is in contact with the oxide semiconductor layer 16 in a contact hole CH provided in the insulating layer. The contact hole CH is a pixel contact hole that connects together the pixel electrode 24 and the oxide semiconductor layer 16. In this example, the contact hole CH is an opening 22p in the interlayer insulating layer 22.

In the present specification, a portion 16s of the oxide semiconductor layer 16 that is in contact with the source electrode 18 is referred to as a "source contact region". A portion 16d of the oxide semiconductor layer 16 that is exposed through the contact hole CH to be in contact with the pixel electrode 24 is referred to as a "drain contact region". A portion 16c of the oxide semiconductor layer 16 that is located between the source contact region 16s and the drain contact region 16d and that overlaps the gate electrode 12 with the gate insulating layer 14 therebetween serves as the "channel region".

Note that the shape of the contact hole CH as shown in the plan view of FIG. 1, etc., is assumed to refer to the shape of the bottom surface of the contact hole CH (i.e., the base surface exposed through the contact hole CH), irrespective of the angle of inclination of the side surface of the contact hole CH. In the example illustrated herein, since the entire contact hole CH is located above the oxide semiconductor layer 16, the shape of the contact hole CH is equal to the shape of the drain contact region 16d.

The common electrode 28 may not be divided into pieces. For example, the common electrode 28 may be arranged so as to cover the display region and have openings formed therein over the TFTs 101 or the pixel contact portions. When applied to a liquid crystal display device of an FFS (Fringe Field Switching) mode, at least one slit 28a or notch is formed in the common electrode 28 for each pixel. A part of the common electrode 28 may overlap the pixel electrode 24 with the dielectric layer 26 therebetween, thus forming a storage capacitor.

In the present embodiment, as seen from the direction normal to the substrate 11, the gate electrode 12 overlaps at least a part of the drain contact region 16d and the channel region 16c. A portion R of the drain contact region 16d that overlaps the gate electrode 12 is referred to as a "first drain contact portion".

As shown in FIG. 2(b), on an arbitrary cross section that extends in the channel width direction (here, the row direction) across the first drain contact portion R, the width Wos of the oxide semiconductor layer 16 in the channel width direction is greater than the width Wg of the gate electrode 12 in the channel width direction, and the gate electrode 12 is covered by the oxide semiconductor layer 16 with the gate insulating layer 14 therebetween. Therefore, even when the contact hole CH is misaligned, the gate electrode 12 is not exposed through the contact hole CH. Thus, it is possible to prevent a failure due to short-circuiting between the gate electrode 12 and the pixel electrode 24, thereby ensuring a high reliability.

In the present embodiment, there is no particular limitation on the width of the bottom surface of the contact hole CH, but it is set to be 2 pm or more, for example, based on the process restrictions (process rules). On an arbitrary cross section that extends in the channel width direction across the first drain contact portion R, there is no particular limitation on the width Wos of the oxide semiconductor layer 16 in the channel width direction, but the width Wos is 3 μm or more, for example, and there is no particular limitation on the width Wg of the gate electrode 12 in the channel width direction, but the width Wg is 2 μm or more, for example. Note that in this example, the width Wos can be set to be smaller than the interval between adjacent source lines S.

The gate electrode 12 and the gate line G may be formed integral together. In the present specification, when the gate electrode 12 and the gate line G are formed integral together, they are referred to collectively as "the gate line G". A portion of the gate line G that is located in a region (the TFT formation region) where the TFT 101 is arranged serves as a "gate electrode 12". Similarly, the source electrode 18 and the source line S may be formed integral together, in which case they are referred to collectively as a "source line S".

As seen from the direction normal to the substrate 11, the source line S may include a main portion S1 extending in the column direction, and a branch portion S2 extending in the row direction from the main portion. As shown in the figure, a part or whole of the branch portion S2 may be in contact with the oxide semiconductor layer 16 (the source contact region 16s).

On the other hand, as seen from the direction normal to the substrate 11, the gate line G may include a main portion G1 extending in the row direction, and a branch portion G2 extending in the column direction from the main portion G1. The oxide semiconductor layer 16 may be arranged so as to cover the branch portion G2 and extend across the main portion G1. In such a case, a portion of the main portion G1 and a whole of the branch portion G2 may overlap the oxide semiconductor layer 16 as shown in the figure. At least a part of the branch portion G2 may overlap the drain contact region.

<Pixel Contact Portion of Semiconductor Device 1001>and Pixel Contact Portion of Reference Examples 1 and 2

Next, advantages of the pixel contact portion of the present embodiment will be described in detail, in comparison with semiconductor devices of reference examples. Note that in the following description, elements having substantially the same function will be denoted by like reference numerals, and the description thereof may be omitted.

FIGS. 3(a) and 3(b) are a plan view and a cross-sectional view, respectively, showing a semiconductor device 2001 of Reference Example 1. The semiconductor device 2001 of Reference Example 1 is different from the semiconductor device 1001 (FIG. 1, FIG. 2) of the present embodiment in that a drain electrode 19 is formed by using the same conductive film as the source electrode 18.

With the semiconductor device 2001 of Reference Example 1, the drain electrode 19 and the source line S are formed by using the same conductive film (typically, a metal film). The drain electrode 19 and the source line S are spaced apart from each other. The drain electrode 19 needs to have a larger size than the bottom surface of the contact hole CH. Therefore, it is difficult to make pixels smaller by further reducing the interval between adjacent source lines S. There is also a problem that the pixel aperture ratio decreases because of the drain electrode 19.

Figure 2:
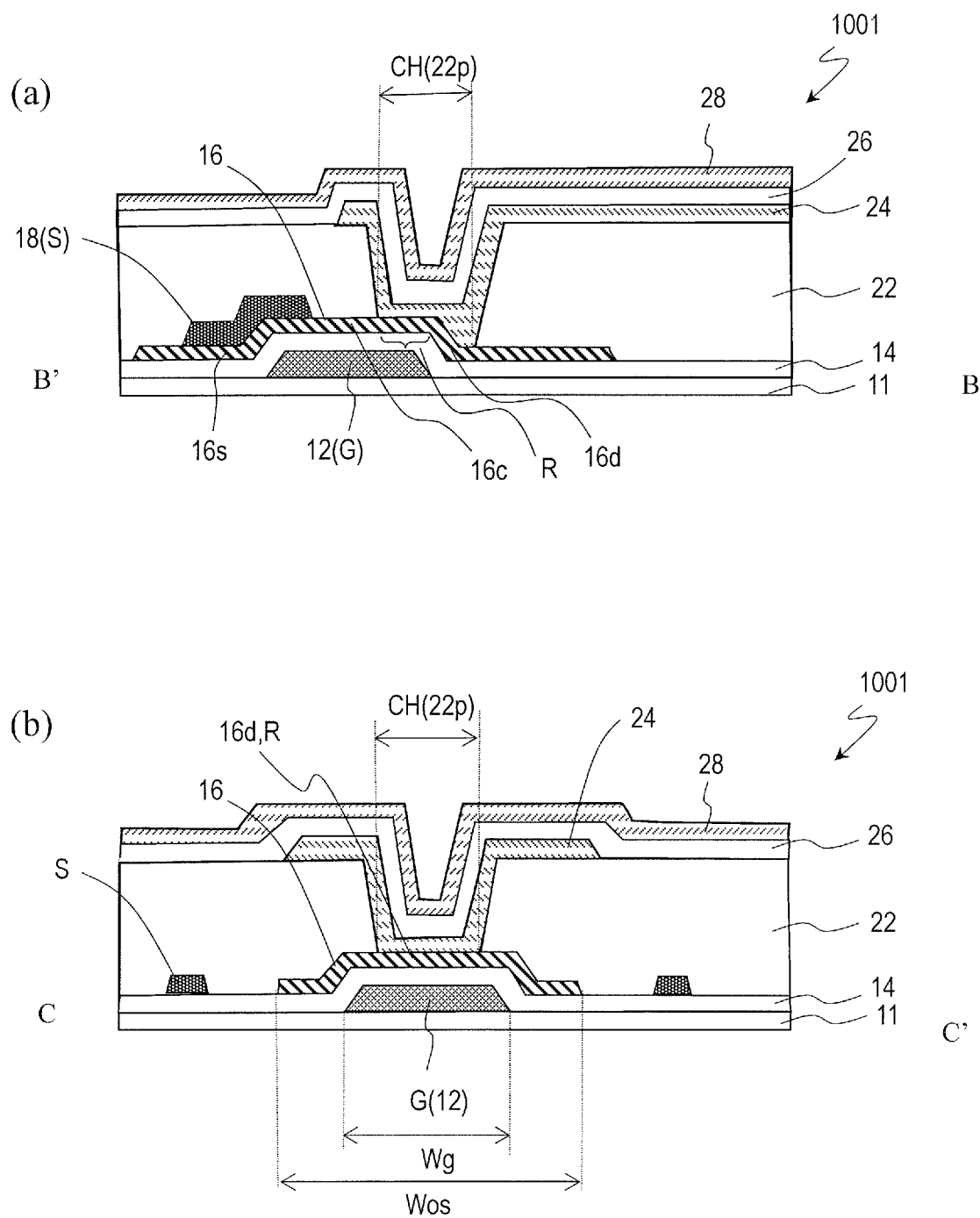
FIG. 2 (a) and (b) are schematic cross-sectional views showing the semiconductor device 1001 taken along line B-B' and line C-C', respectively.

In contrast, with the semiconductor device 1001 shown in FIG. 1 and FIG. 2, there is no drain electrode that is formed by using the same conductive film as the source electrode 18. This eliminates process restrictions and enables the formation of high-definition pixels because the interval between adjacent source lines S can be made smaller than the semiconductor device 2001 of Reference Example 1. Moreover, the pixel contact portion can be formed by only using transparent films, and it is therefore possible to increase the pixel aperture ratio.

Figure 4:
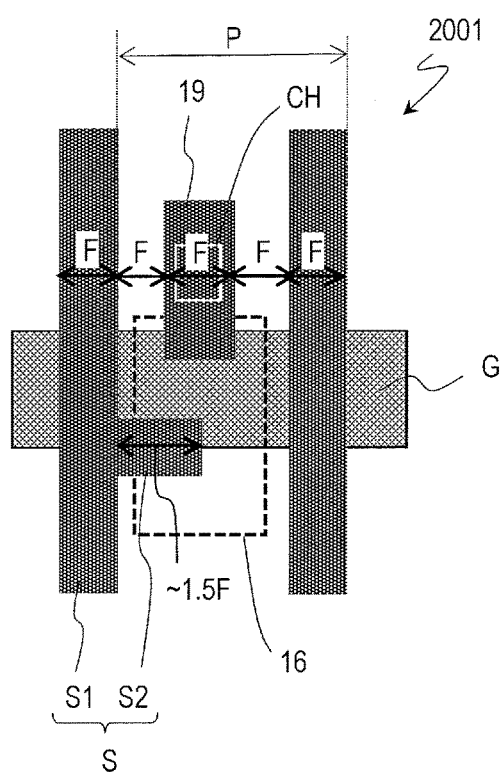
FIG. 4 (a) and (b) are schematic enlarged plan views illustrating the minimum pixel pitch for the semiconductor device 2001 of Reference Example 1 and for the semiconductor device 1001 of the first embodiment, respectively.
Figure 4:
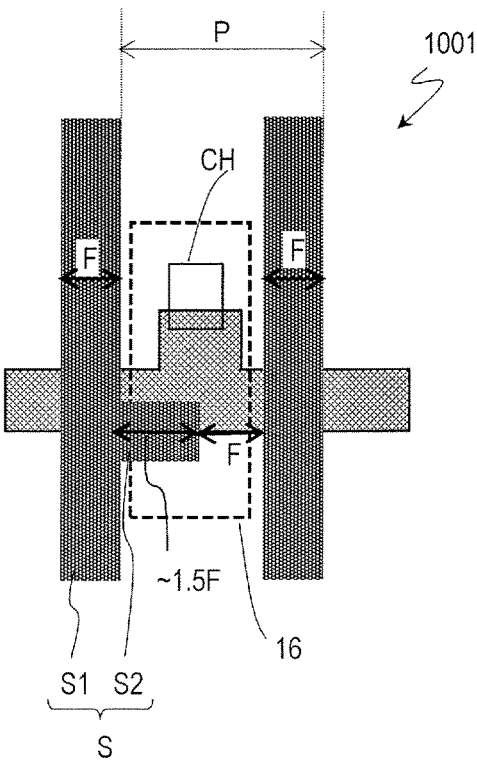

The reason why pixels of a higher definition than Reference Example 1 can be formed according to the present embodiment, despite the same process precision, will be described in detail. FIGS. 4(a) and 4(b) are enlarged plan views showing the pixel contact portion of the semiconductor device 2001 of Reference Example 1 and the pixel contact portion of the semiconductor device 1001 of the present embodiment. The pixel electrode 24 is not shown.

In Reference Example 1, the pixel pitch P is determined based on a region that includes the drain electrode 19. The pixel pitch P is at minimum when the width of the drain electrode 19, the distance between the drain electrode 19 and the source line S, and the width of the source line S are each set to the minimum process dimension F of the source line S, as shown in FIG. 4(a). The smallest value of the pixel pitch is 4×F.

In contrast, with the semiconductor device 1001, the pixel pitch P is determined based on a region that includes the branch portion S2 of the source line S. The pixel pitch P is at minimum when the distance between the branch portion S2 of a source line S and an adjacent source lines S, and the width of the source line S are each set to the minimum process dimension F of the source line S, and the length of the branch portion of the source line S is set to be about 1.5×F, as shown in FIG. 4(b). It can be seen that the smallest value of the pixel pitch P is 3.5×F, which is less than that of the semiconductor device 2001.

As an example, when the minimum process dimension F is 3 μm, according to Reference Example 1, the minimum pixel pitch is 12 μm and the highest possible pixel density is 706 ppi, whereas according to the present embodiment, the minimum pixel pitch is 10.5 μm, allowing the pixel density to be increased up to 806 ppi. When the minimum process dimension F is 2.5 μm, according to Reference Example 1, the minimum pixel pitch is 10 μm and the highest possible pixel density is 847 ppi, whereas according to the present embodiment, the minimum pixel pitch is 8.75 µm, allowing the pixel density to be increased up to 968 ppi.

Figure 5:
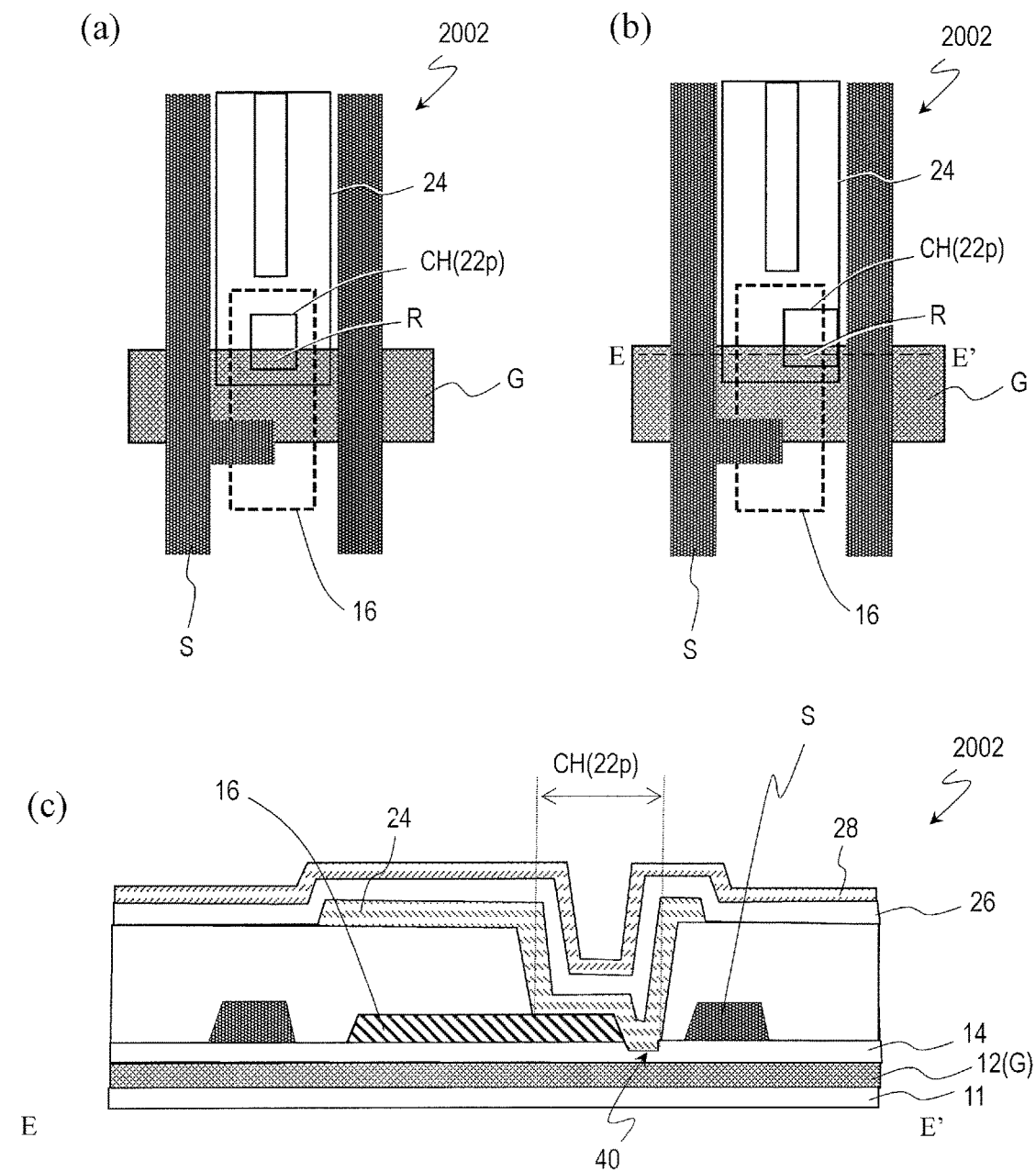
FIG. 5 (a) is a plan view showing a semiconductor device 2002 of Reference Example 2, and (b) and (c) are a plan view and a cross-sectional view, respectively, showing an example of the semiconductor device 2002 where the pixel contact hole is misaligned.

FIGS. 5(a) to 5(c) schematically show a semiconductor device 2002 of Reference Example 2, wherein FIG. 5(a) is a plan view, and FIGS. 5(b) and 5(c) are a plan view and a cross-sectional view, respectively, showing a case where the contact hole CH is misaligned. FIG. 5(c) shows a cross section taken along line E-E' of FIG. 5(b).

With the semiconductor device 2002 of Reference Example 2, a part of a portion (main portion) of the gate line G extending in the row direction is used as the gate electrode 12. As seen from the direction normal to the substrate 11, the contact hole CH (or the drain contact region 16d) partially overlaps the gate electrode 12. As shown in FIG. 5(c), on an arbitrary cross section that extends in the channel width direction across a portion (the first drain contact portion) R of the drain contact region 16d that overlaps the gate electrode 12, the width of the gate electrode 12 is greater than the width of the oxide semiconductor layer 16.

With the semiconductor device 2002 of Reference Example 2, when the contact hole CH is shifted in the row direction due to misalignment, the contact hole CH may not be entirely located over the oxide semiconductor layer 16 and a part of the contact hole CH may not overlap the oxide semiconductor layer 16, as seen from the direction normal to the substrate 11, as shown in FIG. 5(b). In such a case, a part of the oxide semiconductor layer 16 and a part of the gate insulating layer 14 are exposed through the contact hole CH, as shown in FIG. 5(c). While etching the interlayer insulating layer 22 in order to form the contact hole CH, the vicinity of the surface of an exposed portion 40 of the gate insulating layer 14 may be etched, thereby reducing the thickness of the gate insulating layer 14 (thinning). If the thinning proceeds to etch, in the thickness direction, the exposed portion 40 of the gate insulating layer 14, the gate line G is exposed. As a result, when the pixel electrode 24 is formed in the contact hole CH, the pixel electrode 24 and the gate line G may be short-circuited with each other in the contact hole CH.

Figure 13:
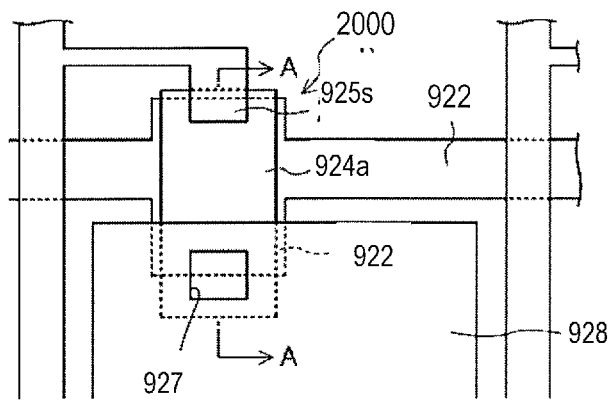
FIG. 13 (a) and (b) are a plan view and a cross-sectional view, respectively, showing a semiconductor device 2000 disclosed in Patent Document No. 2.
Figure 13:
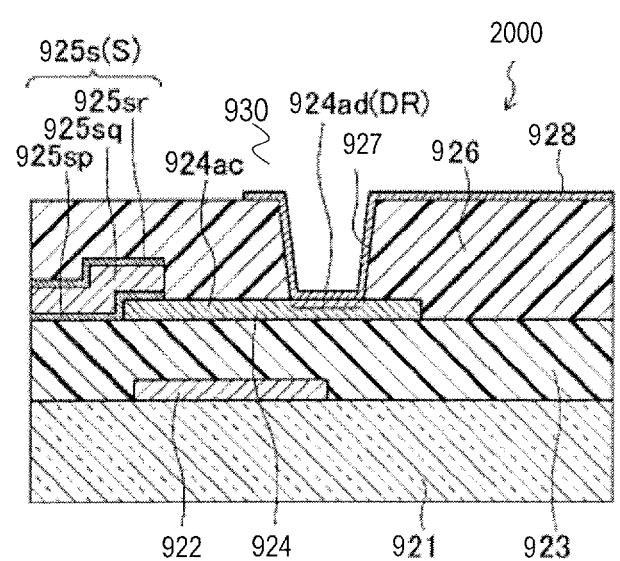

Note that although the main portion of the gate line is used as the gate electrode in Reference Example 2, the branch portion of the gate line may be used as the gate electrode. Also in such a case, with conventional techniques, the width of the gate electrode in the channel width direction is set to be larger than the width of the oxide semiconductor layer in the channel width direction (e.g., Patent Document No. 2 (FIG. 13)). Therefore, as in Reference Example 2, when the position of the pixel contact hole is shifted in the channel width direction, the pixel electrode may possibly be short-circuited with the gate electrode.

Figure 6:
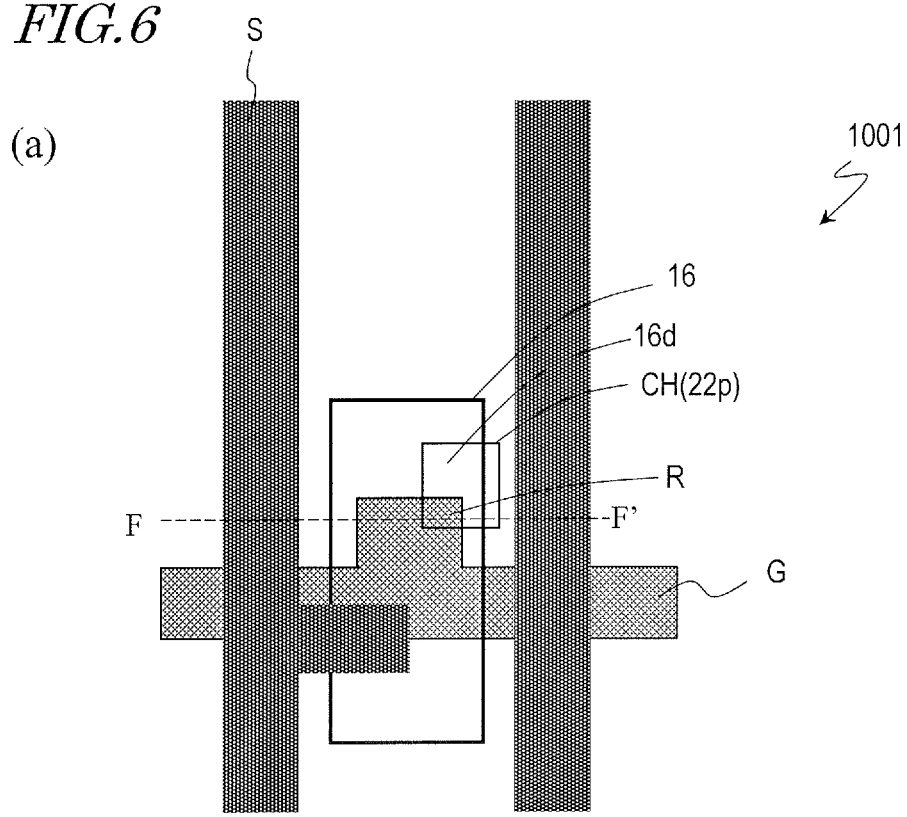
FIG. 6 (a) and (b) are a plan view and a cross-sectional view, respectively, illustrating the semiconductor device 1001 of the first embodiment where the pixel contact hole is misaligned.
Figure 6:
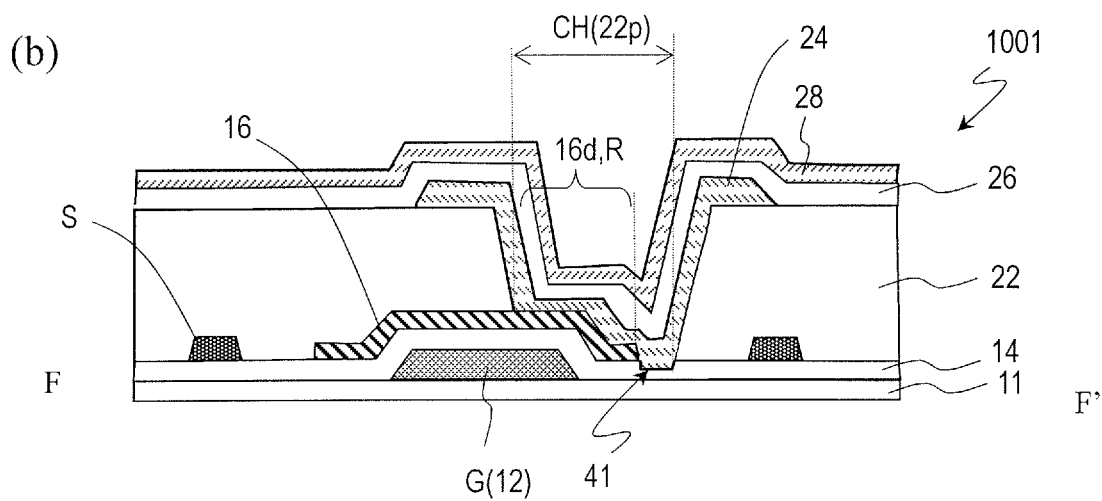

In contrast, according to the present embodiment, in a region where the pixel contact portion is formed, the width of the gate electrode 12 in the channel width direction is smaller than the width of the oxide semiconductor layer 16 in the channel width direction, and the gate electrode 12 is covered by the oxide semiconductor layer 16 with the gate insulating layer 14 therebetween. Therefore, even when the position of the contact hole CH is shifted in the row direction to expose a part of the gate insulating layer 14, the gate line G (including the gate electrode 12) is not present under the exposed portion of the gate insulating layer 14, as illustrated in FIGS. 6(a) and 6(b). Therefore, even when thinning occurs to the exposed portion of the gate insulating layer 14 during the formation of the contact hole CH, it is possible to prevent a short-circuit between the pixel electrode 24 and the gate line G.

<Regarding Oxide Semiconductor Layer 16>

Now, the oxide semiconductor layer 16 used in the present embodiment will be described.

The "oxide semiconductor layer" as used in the present specification is a layer that including a semiconductor region that functions as the active layer of an oxide semiconductor TFT. The oxide semiconductor layer in some cases includes a region where the resistance is locally lowered (a low resistance region or a conductor region). For example, when the oxide semiconductor layer is in contact with a conductor layer such as a metal layer or a reducing insulative layer, a portion of the surface of the oxide semiconductor layer that is in contact with the conductor layer serves as a low resistance region that has a lower electric resistance than the semiconductor region. The resistance of only the surface of the oxide semiconductor layer may be lowered in some cases, and the resistance of the oxide semiconductor layer may be lowered across the thickness direction thereof in other cases.

The oxide semiconductor included in the semiconductor region of the oxide semiconductor layer 16 may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor whose c-axis is oriented generally perpendicular to the layer surface.

The oxide semiconductor layer 16 may have a layered structure including two or more layers. When the oxide semiconductor layer 16 has a layered structure, the oxide semiconductor layer 16 may include a non-crystalline oxide semiconductor layer and a crystalline oxide semiconductor layer. Alternatively, it may include a plurality of crystalline oxide semiconductor layers having different crystalline structures. It may include a plurality of non-crystalline oxide semiconductor layers. When the oxide semiconductor layer 16 has a two-layer structure including an upper layer and a lower layer, it is preferred that the energy gap of the oxide semiconductor included in the upper layer is greater than the energy gap of the oxide semiconductor included in the lower layer. Note however that when the energy gap difference between these layers is relatively small, the energy gap of the oxide semiconductor of the lower layer may be greater than the energy gap of the oxide semiconductor of the upper layer.

The material, the structure, the film formation method of the non-crystalline oxide semiconductor and each of the crystalline oxide semiconductors, and the configuration of an oxide semiconductor layer having a layered structure, etc., are described in Japanese Laid-Open Patent Publication No. 2014-007399, for example. The disclosure of Japanese Laid-Open Patent Publication No. 2014-007399 is herein incorporated by reference in its entirety.

The oxide semiconductor layer 16 may at least include one metal element from among In, Ga and Zn, for example. In the present embodiment, the oxide semiconductor layer 16 includes an In—Ga—Zn—O-based semiconductor (e.g., indium gallium zinc oxide), for example. Now, the In—Ga—Zn—O-based semiconductor is a ternary oxide of In (indium), Ga (gallium) and Zn (zinc), and there is no particular limitation on the ratio (composition ratio) between In, Ga and Zn, examples of which include In:Ga:Zn=2:2:1, In:Ga:Zn=1:1:1 and In:Ga:Zn=1:1:2, for example. Such an oxide semiconductor layer 16 can be formed from an oxide semiconductor film including an In—Ga—Zn—O-based semiconductor. Note that a channel-etch type TFT having an active layer including an oxide semiconductor such as an In—Ga—Zn—O-based semiconductor is in some cases referred to as a "CE-OS-TFT".

The in-Ga—Zn—O-based semiconductor may be amorphous or crystalline. The crystalline In—Ga—Zn—O-based semiconductor is preferably a crystalline In—Ga—Zn—O-based semiconductor whose c-axis is oriented generally perpendicular to the layer surface.

Note that crystalline structures of crystalline In—Ga—Zn—O-based semiconductors are disclosed in, for example, Japanese Laid-Open Patent Publication No. 2014-007399, supra, Japanese Laid-Open Patent Publication No. 2012-134475, Japanese Laid-Open Patent Publication No. 2014-209727, etc. The disclosures of Japanese Laid-Open Patent Publication No. 2012-134475 and Japanese Laid-Open Patent Publication No. 2014-209727 are herein incorporated by reference in their entirety. Since TFTs including an In—Ga—Zn—O-based semiconductor layer have a high mobility (more than 20 times that of an a-SiTFT) and a low leak current (less than 1/100 that of an a-SiTFT), they can desirably be used as driver TFTs (e.g., TFTs included in driver circuits provided around the display region including a plurality of pixels and on the same substrate as the display region) and pixel TFTs (TFTs provided in pixels).

The oxide semiconductor layer 16 may include another oxide semiconductor instead of an In—Ga—Zn—O-based semiconductor. For example, it may include an In—Sn—Zn—O-based semiconductor (e.g., $In_2O_3$—$SnO_2$—$ZnO$; InSnZnO). The In—Sn—Zn—O-based semiconductor is a ternary oxide of In (indium), Sn (tin) and Zn (zinc). Alternatively, the oxide semiconductor layer 16 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, or the like.

<Method for Manufacturing Semiconductor Device>

Referring again to FIG. 1 and FIG. 2, an example of a method for manufacturing the semiconductor device 1001 will be described.

First, the gate line G including the gate electrode 12 is formed on the substrate 11. Herein, a gate line metal film (thickness: 50 nm or more and 500 nm or less, for example) (not shown) is formed on a substrate (e.g., a glass substrate) 11 by a sputtering method, or the like. Next, the gate line metal film is processed into an intended shape by a photolithography step. Thus, the gate line G is obtained. In the illustrated example, the gate line G is formed that includes the main portion G1 extending in the row direction and the branch portion G2 extending in the column direction from the main portion G1, and a part of the branch portion G2 and a part of the main portion G1 are made to function as the gate electrode 12.

The substrate 11 may be, for example, a glass substrate, a silicon substrate, a heat-resistant plastic substrate (resin substrate), or the like.

The gate line metal film may suitably be a film including a metal such as aluminum (Al), tungsten (W), molybdenum (Mo), tantalum (Ta), chromium (Cr), titanium (Ti) or copper (Cu), for example, an alloy thereof, or a metal nitride thereof. It may be a layered film including a plurality of films of some of these elements. Herein, it may be a layered film (W/TaN) whose upper layer is a W film (thickness: 300 nm) and whose lower layer is TaN (thickness: 30 nm), for example.

Next, the gate insulating layer 14 is formed so as to cover the gate line G. The gate insulating layer 14 may suitably be a silicon oxide ($SiO_2$) layer, a silicon nitride (SiNx) layer, a silicon oxide nitride (SiOxNy; x>y) layer, a silicon nitride oxide (SiNxOy; x>y) layer, or the like. The gate insulating layer 14 may have a layered structure including a lower layer and an upper layer that are layered in this order starting from the substrate 11 side. For example, a silicon nitride layer, a silicon nitride oxide layer, or the like, may be formed as the lower layer in order to prevent the diffusion of impurities, etc., from the substrate 11, and a silicon oxide layer, a silicon oxide nitride layer, or the like, may be formed as the upper layer in order to ensure the insulation. Note that if an oxygen-containing layer (e.g., an oxide semiconductor layer such as $SiO_2$) is used as the uppermost layer (i.e., a layer to be in contact with the oxide semiconductor) of the gate insulating layer 14, it is possible to effectively reduce the oxygen deficiency of the oxide semiconductor layer because it is possible to recover oxygen deficiency by means of oxygen included in the gate insulating layer 14 when oxygen deficiency occurs in the oxide semiconductor layer. Herein, by using a CVD method, for example, the gate insulating layer 14 having a layered structure whose lower layer is a silicon nitride (SiNx) layer (thickness: 325 nm) and whose upper layer is a silicon oxide ($SiO_2$) layer (thickness: 50 nm).

Next, an oxide semiconductor film (thickness: 20 nm or more and 200 nm or less, for example) is deposited on the gate insulating layer 14 by using a sputtering method, for example, and then the oxide semiconductor film is patterned, thereby forming an island-shaped oxide semiconductor layer 16. As seen from the direction normal to the substrate 11, the oxide semiconductor layer 16 is arranged so that a part thereof overlaps the gate electrode 12 with the gate insulating layer 14 therebetween. In the illustrated example, the oxide semiconductor layer 16 is arranged so as to extend across the main portion G1 of the gate line G and cover the branch portion G2 of the gate line G.

Herein, the oxide semiconductor layer 16 is formed by patterning an In—Ga—Zn—O-based oxide semiconductor film (thickness: 50 nm, for example) including In, Ga and Zn at a ratio of 1:1:1, for example. While the oxide semiconductor layer 16 formed described above is composed of an oxide semiconductor, the resistance thereof may be locally lowered by coming into contact with a conductor in a subsequent process.

Next, a source line metal film (thickness: 50 nm or more and 500 nm or less) is formed on the oxide semiconductor layer 16 and the gate insulating layer 14, and the source line metal film is patterned, thereby forming the source line S including the source electrode 18. The source electrode 18 is arranged so as to be in contact with the upper surface of the oxide semiconductor layer 16. A portion of the oxide semiconductor layer 16 that is to be in contact with the source electrode 18 is the source contact region 16s. In this example, as seen from the direction normal to the substrate 11, the source line S includes the main portion S1 extending in the column direction and the branch portion S2 extending in the row direction from the main portion S1, and is arranged so that a part of the branch portion S2 is in contact with the oxide semiconductor layer 16 and functions as the source electrode 18.

The source line metal film may suitably be a film including a metal such as aluminum (Al), tungsten (W), molybdenum (Mo), tantalum (Ta), copper (Cu), chromium (Cr) or titanium (Ti), for example, an alloy thereof, or a metal nitride thereof. It may be a layered film including a plurality of films of some of these elements. Herein, it may be a layered film (Ti/Al/Ti) including a Ti film (thickness: 30 nm), an Al film (thickness: 200 nm) and a Ti film (thickness: 100 nm) that are layered in this order starting from the substrate 11 side, for example.

Next, the interlayer insulating layer 22 is formed so as to cover the source line S. Then, an opening 22a is formed in the interlayer insulating layer 22 so as to expose a part of the oxide semiconductor layer 16 therethrough. In this example, the opening 22a serves as the pixel contact hole CH.

A material similar to that of the gate insulating film may be used as the material of the interlayer insulating layer 22. The interlayer insulating layer 22 may be a single layer or may have a layered structure. The interlayer insulating layer 22 may be an inorganic insulating layer or may be an organic insulating layer film. Alternatively, it may have a layered structure of an organic insulating film and an inorganic insulating film. An $SiO_2$ film (thickness: 300 nm) may be formed by a CVD method as the interlayer insulating layer 22. Alternatively, a positive-type photosensitive resin film having a thickness of 2000 nm, for example, may be formed.

The method and conditions for etching the contact hole CH are selected so that the etching rate for the oxide semiconductor layer 16 is lower than the etching rate for the interlayer insulating layer 22. Therefore, the oxide semiconductor layer 16 is not substantially etched, and is exposed on the bottom surface of the contact hole CH.

The width of the bottom surface of the contact hole CH is set to be smaller than the width of the oxide semiconductor layer 16. It is preferred that the entire bottom surface of the contact hole CH is located on the oxide semiconductor layer 16. Note that a part of the bottom surface of the contact hole CH may be located on the gate insulating layer 14 due to misalignment, etc. In such a case, while etching the contact hole CH, the surface portion of the gate insulating layer 14 may be etched (overetched), thereby reducing the thickness of the gate insulating layer 14 (thinning).

Next, a first transparent conductive film (thickness: 20 to 300 nm) is formed on the interlayer insulating layer 22 and in the contact hole CH, and the first transparent electrode film is patterned so as to form the pixel electrode 24. The material of the first transparent electrode film may be an oxide semiconductor such as ITO, IZO, ZnO, etc.

Herein, an IZO film (thickness: 100 nm) is formed as the first transparent conductive film by a sputtering method, for example. Then, the IZO film is patterned by using a photolithography process, thereby forming the pixel electrode 24. The pixel electrode 24 is arranged so as to be in contact with the upper surface of the oxide semiconductor layer 16 in the contact hole CH. A portion of the oxide semiconductor layer 16 that is in contact with the pixel electrode 24 is the drain contact region 16d.

Next, the dielectric layer 26 and the common electrode 28 are formed on the pixel electrode 24.

The material of the dielectric layer 26 may be an inorganic insulating material similar to the gate insulating layer 14. Herein, an SiNx film (thickness: 100 nm) is formed by CVD, for example.

The common electrode 28 is obtained by forming a second transparent electrode film on the dielectric layer 26 and patterning the second transparent electrode film. The material of the second transparent electrode film may be a material similar to the first transparent electrode film. Herein, an IZO film (thickness: 100 nm) is formed by a sputtering method, for example. Then, the second transparent electrode film is patterned by using a photolithography process, thereby forming the common electrode 28. The common electrode 28 may be provided with at least one opening (or a notch) 28a for each pixel. The semiconductor device 1001 is manufactured as described above.

The semiconductor device 1001 can be desirably applied to a liquid crystal display device of an FFS mode, for example. A liquid crystal display device is manufactured as follows, for example.

First, a counter substrate is manufactured. For the counter substrate, for example, a light blocking film (a Ti film having a thickness of 200 nm, for example) is formed on a glass substrate and the light blocking film is patterned into an intended shape, thereby obtaining a black matrix. Next, R, G and B color filters are produced at their respective intended positions, thereby obtaining the counter substrate. Note that when applied to a liquid crystal display device of a vertical electric field mode, a counter electrode is arranged on the liquid crystal layer-side surface of the color filter.

Next, after photospacers are arranged on the semiconductor device (TFT substrate) 1001, the TFT substrate 1001 and the counter substrate are attached together. Then, a liquid crystal material is injected into the gap between these substrates, thereby obtaining a liquid crystal layer. Thereafter, as necessary, the substrate is severed into pieces of an intended size, thereby obtaining liquid crystal display devices.

<Alternative Embodiments>

The TFT 101 of the present embodiment may have a channel-etch structure or an etch stop structure having an etch stop covering the channel region.

In the example shown in FIG. 1 and FIG. 2, the TFT 101 has a channel-etch structure. With a "channel-etch type TFT", as can be seen from FIG. 2, no etch stop layer is formed over the channel region 16c, and the lower surface of the channel-side end portion of the source electrode 18 is arranged so as to be in contact with the upper surface of the oxide semiconductor layer 16. The source electrode 18 of the channel-etch type TFT is formed by, for example, forming a source conductive film on the oxide semiconductor layer 16, and patterning the conductive film. In this process, a surface portion of the channel region 16c may be etched.

Figure 7:
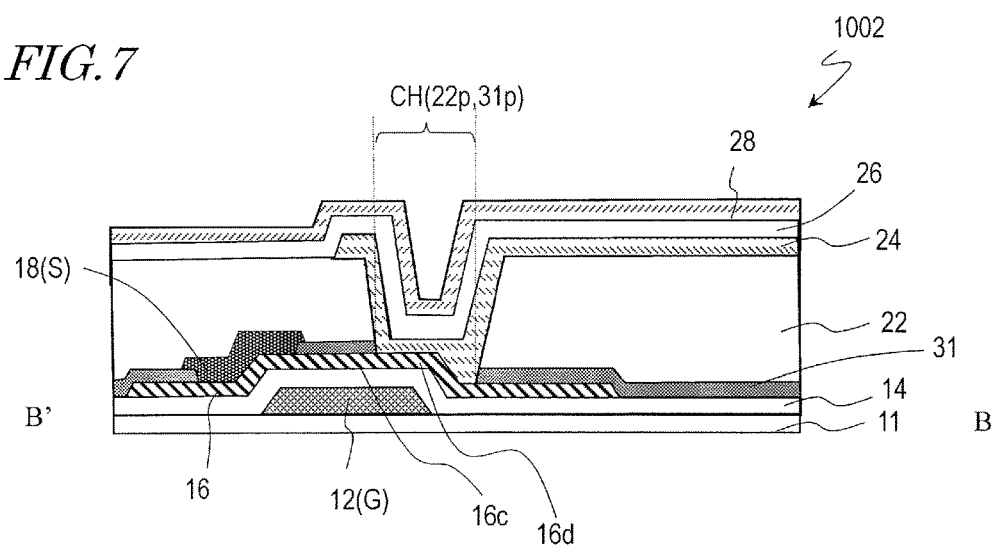
FIG. 7 A schematic cross-sectional view showing another semiconductor device 1002 of the first embodiment.

FIG. 7 is a cross-sectional view illustrating a semiconductor device 1002 including an etch stop-type TFT. The structure as seen from above of the semiconductor device 1002 is similar to FIG. 1. FIG. 7 is equivalently a cross-sectional view taken along line B-B' shown in FIG. 1.

As illustrated in FIG. 7, the etch stop-type TFT includes an etch stop layer 31 that covers a portion of the oxide semiconductor layer 16 that serves as the channel region 16c.

The semiconductor device 1002 can be manufactured as follows, for example. First, the oxide semiconductor layer 16 is formed on the gate insulating layer 14, and then the etch stop layer (insulative protection layer) 31 is formed so as to cover the oxide semiconductor layer 16. The etch stop layer 31 is provided with an opening through which a portion of the oxide semiconductor layer 16 serving as the source contact region is exposed. Next, a source conductive film is formed on the etch stop layer 31 and in the opening, and the source conductive film is patterned, thereby forming the source electrode 18. Therefore, the lower surface of the channel-side end portion of the source electrode 18 is located on the etch stop layer 31, for example. Next, after the interlayer insulating layer 22 is formed, the contact hole CH is provided, through which a part of the oxide semiconductor layer 16 is exposed. The contact hole CH may be formed by simultaneously etching the interlayer insulating layer 22 and the etch stop layer 31. In such a case, as shown in FIG. 7, the contact hole CH includes the opening 22a of the interlayer insulating layer 22 and an opening 31p of the etch stop layer 31. Thereafter, the pixel electrode 24, the dielectric layer 26 and the common electrode 28 are formed by a method similar to the semiconductor device 1001, thereby obtaining the semiconductor device 1002.

Although not shown in the figure, the semiconductor device of the present embodiment does not need to include the dielectric layer 26 and the common electrode 28. In such a case, an alignment film (not shown) may be formed on the pixel electrode 24. Such a semiconductor device is used in a liquid crystal display device of a vertical electric field mode such as the TN (Twisted Nematic) mode or the VA (Vertical Alignment) mode, for example.

The light-transmissive electrode (transparent electrode) to be in contact with the drain contact region 16d of the TFT 101 is not limited to the pixel electrode 24, but may be any other electrode or line. For example, it may be a connecting electrode that connects together the pixel electrode 24 and the oxide semiconductor layer 16. In the present specification, a transparent electrode to be in contact with the drain contact region 16d may be referred to simply as a "transparent electrode".

(Second Embodiment)

A semiconductor device according to a second embodiment will now be described with reference to the drawings.

With the semiconductor device 1001 (FIG. 1 and FIG. 2) of the above-described embodiment, the branch portion G2 of the gate line G is rectangular, as seen from the direction normal to the substrate 11. A portion of the branch portion G2 of the gate line G that is located under the contact hole CH (i.e., the drain contact region 16d) and a portion thereof that is located under the channel region 16c have substantially the same width in the channel width direction. In contrast, the semiconductor device of the present embodiment is different from the semiconductor device 1001 shown in FIG. 1 and FIG. 2 in that the width of the branch portion G2 of the gate line G in the channel width direction under the contact hole CH is smaller than that under the channel region 16c.

Figure 8:
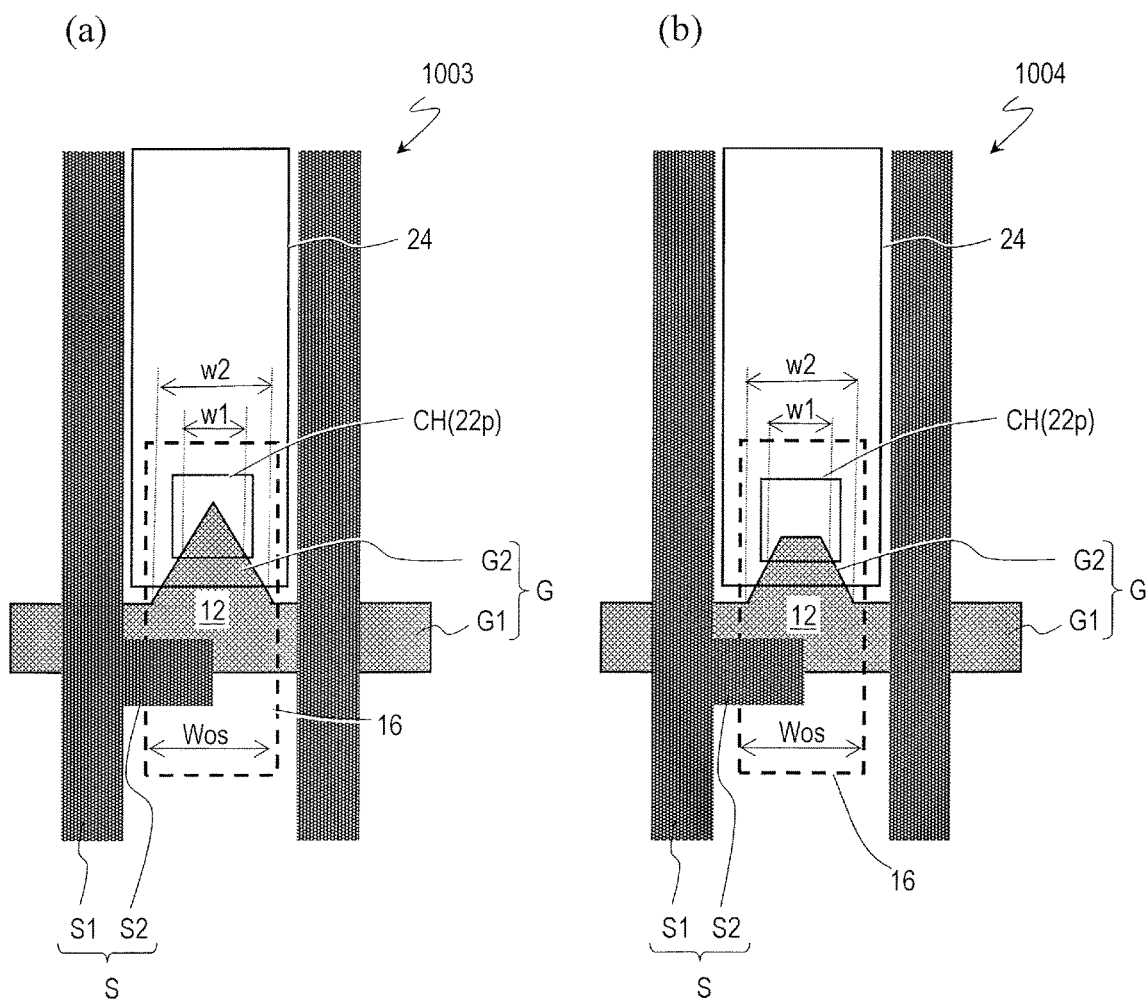
FIG. 8 (a) and (b) are plan views illustrating semiconductor devices 1003 and 1004, respectively, of the second embodiment.

FIGS. 8(a) and 8(b) are plan views schematically showing semiconductor devices 1003 and 1004, respectively, of the second embodiment. The cross-sectional structures of the semiconductor devices 1003 and 1004 will not be described below as they are similar to the structure shown in FIGS. 2(a) and 2(b). Only what is different from the semiconductor device 1001 of the above-described embodiment will now be described.

With the semiconductor devices 1003 and 1004, as seen from the direction normal to the substrate 11, the branch portion G2 of the gate line G includes a first portion that overlaps the drain contact region 16d and a second portion that is located between the first portion and the main portion G1. The maximum width w1 of the first portion in the channel width direction is smaller than the maximum width w2 of the second portion in the channel width direction. The branch portion G2 may have a shape as seen from above such that the width thereof in the channel width direction gradually decreases away from the main portion G1. For example, the shape as seen from above of the branch portion G2 of the semiconductor device 1003 is a triangle whose base is on the main portion G1 side. The shape as seen from above of the branch portion G2 of the semiconductor device 1004 is a trapezoid whose base is on the main portion G1 side. Thus, by setting the width of the gate electrode 12 to be small under the drain contact region 16d and setting the width of the gate electrode 12 to be large on the channel side, it is possible to increase the area of the channel region 16c. Therefore, it is possible to reduce the ON resistance of the TFT 101 while preventing a short-circuit between the gate electrode 12 and the pixel electrode 24.

The width w2 of the second portion of the branch portion G2 in the channel width direction may be larger than the width Wos of the oxide semiconductor layer 16 in the channel width direction. Then, it is possible to further increase the area of the channel region 16c. Alternatively, the maximum width w2 of the second portion of the branch portion G2 in the channel width direction may be smaller than the width Wos of the oxide semiconductor layer 16 in the channel width direction. Then, even if misalignment occurs in the column direction, it is possible to more reliably prevent a short-circuit failure.

(Third Embodiment)

A semiconductor device according to a third embodiment will now be described with reference to the drawings. The semiconductor device of the present embodiment is different from the above-described embodiment in that the upper layer of a two-layer transparent electrode is used as the pixel electrode.

FIGS. 9(a) and 9(b) are a plan view and a cross-sectional view, respectively, schematically showing a semiconductor device 1005 according to the third embodiment. FIG. 9(b) shows a cross section taken along line H-H' of FIG. 9(a).

With the semiconductor device 1005, the common electrode 28 is arranged on the substrate 11 side of the pixel electrode 24 with the dielectric layer 26 therebetween. The pixel electrode 24 is divided into pieces corresponding to pixels. The interlayer insulating layer 22 and the dielectric layer 26 are provided with the contact hole CH that reaches the oxide semiconductor layer 16. The contact hole CH includes the opening 22p of the interlayer insulating layer 22 and an opening 26p of the dielectric layer 26. The pixel electrode 24 is arranged on the dielectric layer 26 and in the contact hole CH, and is in contact with the oxide semiconductor layer 16 in the contact hole CH. The configuration is otherwise similar to the semiconductor device 1001.

The common electrode 28 may not be divided into pieces. For example, the common electrode 28 may be provided generally across the entire display region other than pixel contact portions. In this example, the common electrode 28 has an opening 28p that is arranged so as to overlap the pixel contact portion. As seen from the direction normal to the substrate 11, the contact hole CH may be located within the outline of the opening 28p.

Figure 9:
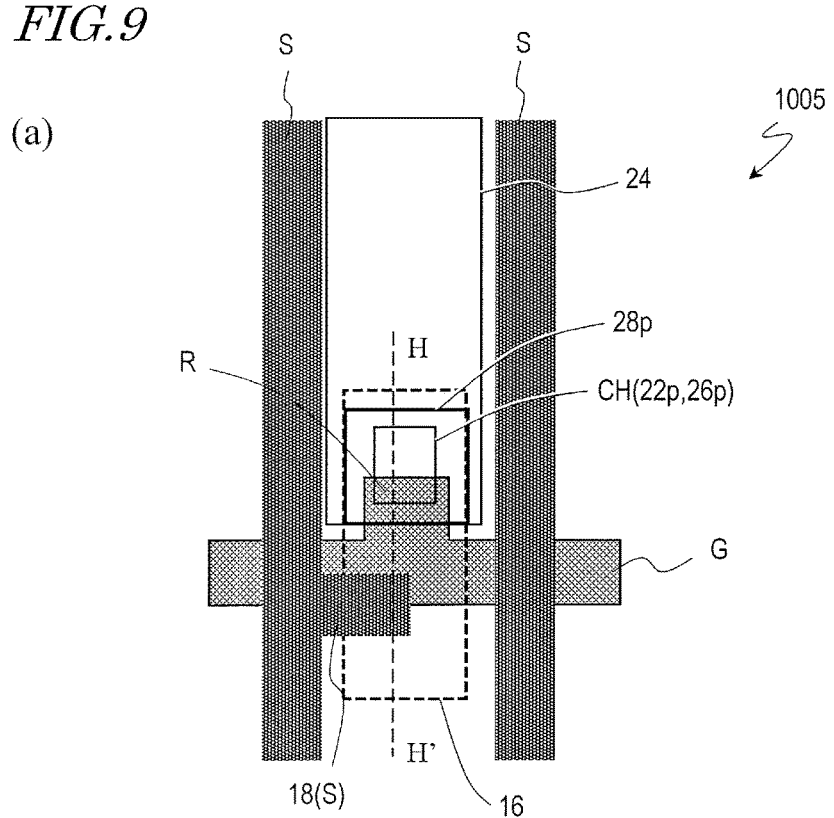
FIG. 9 (a) and (b) are a plan view and a cross-sectional view, respectively, illustrating a semiconductor device 1005 of the third embodiment.
Figure 9:
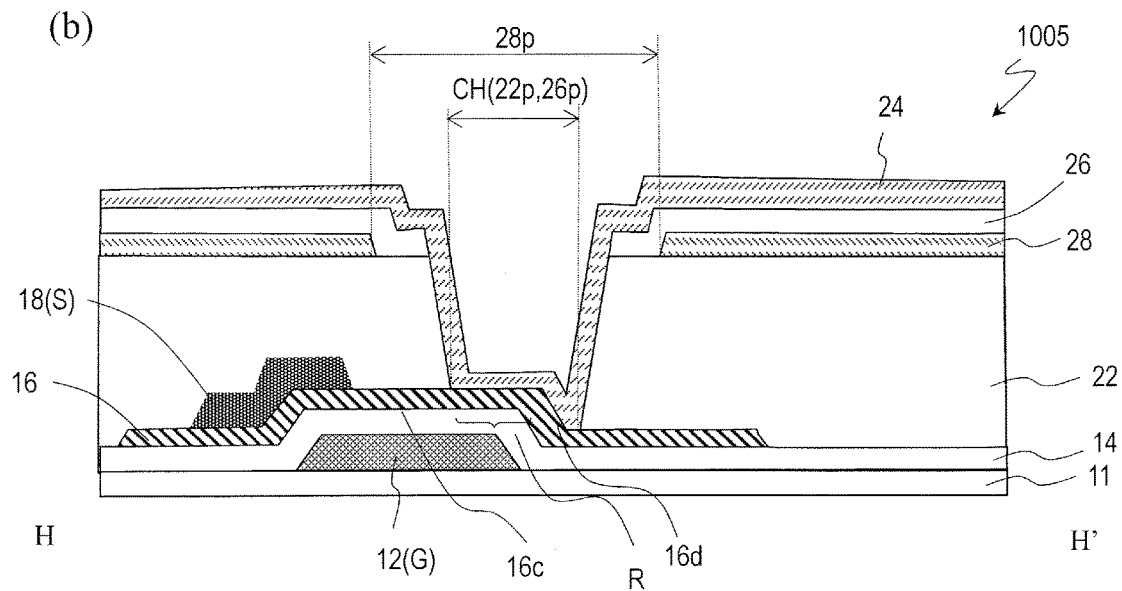

The semiconductor device of the present embodiment is not limited to the configuration shown in FIG. 9. For example, a connecting electrode that is electrically separated from the common electrode 28 may be arranged in the opening 28p. The connecting electrode is formed by using the same transparent conductive film as the common electrode 28. The connecting electrode may be arranged so as to be in contact with the drain contact region 16d in the contact hole CH, and the pixel electrode 24 may be arranged so as to be in contact with the connecting electrode in the contact hole CH. Thus, the pixel electrode 24 is electrically connected to the oxide semiconductor layer 16 with the connecting electrode therebetween.

Figure 10:
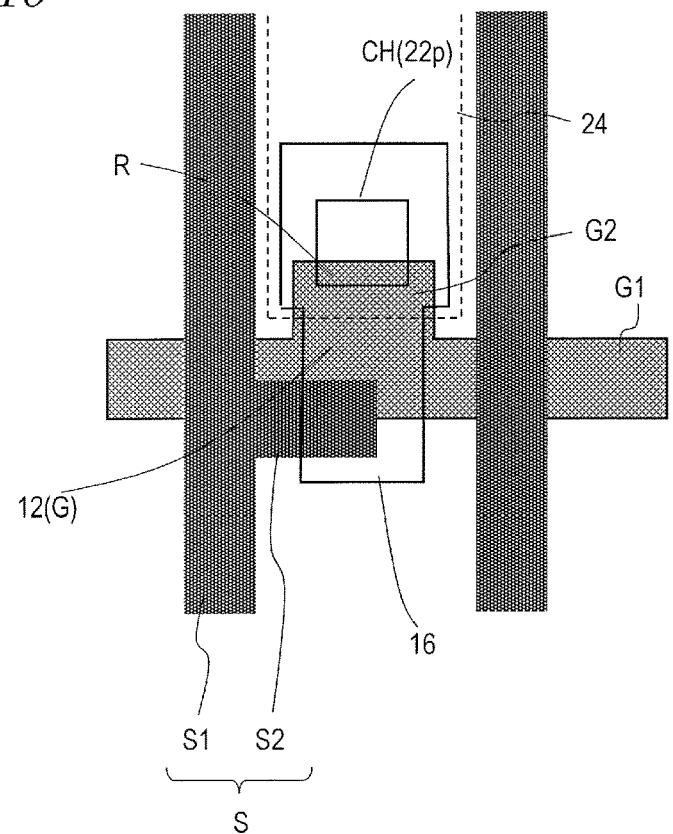
FIG. 10 A plan view illustrating a semiconductor device of another embodiment.

Although the oxide semiconductor layer 16 is rectangular in the first to third embodiments described above, the shape of the oxide semiconductor layer 16 does not need to be rectangular. For example, as illustrated in FIG. 10, the width of a portion of the oxide semiconductor layer 16 that includes the drain contact region 16*d* may be larger than the width of a portion thereof that includes the channel region 16*c*. Then, it is only required that the width of the oxide semiconductor layer 16 be larger than the width of the gate electrode 12 on an arbitrary cross section that extends in the channel width direction across the first drain contact portion R, and the width of the oxide semiconductor layer 16 may be smaller than the width of the gate electrode 12 on a cross section that extends in the channel width direction across the channel region 16*c*. Thus, it is possible to prevent a short-circuit between the gate electrode 12 and the pixel electrode 24 while ensuring a sufficient area of the channel region 16*c*.

With any of the embodiments described above, the TFT 101 has a TFT vertical arrangement in which the source contact region 16*s*, the channel region 16*c* and the drain contact region 16*d* are arranged next to each other in this order in the column direction. Note that the TFT 101 may have a TFT horizontal arrangement in which the source contact region 16*s*, the channel region 16*c* and the drain contact region 16*d* are arranged next to each other in the row direction.

(Fourth Embodiment)

A semiconductor device according to a fourth embodiment of the present invention will now be described with reference to the drawings. The semiconductor device of the present embodiment is an active matrix substrate including oxide semiconductor TFTs and crystalline silicon TFTs formed on the same substrate.

The active matrix substrate includes a TFT (pixel TFT) for each pixel. The pixel TFT is an oxide semiconductor TFT using an In—Ga—Zn—O-based semiconductor film, for example, as the active layer.

A part or whole of peripheral driver circuits is in some cases formed integral on the same substrate as the pixel TFTs. Such an active matrix substrate is called a driver-monolithic active matrix substrate. In a driver-monolithic active matrix substrate, peripheral driver circuits are provided in a region (the non-display region or the bezel region) other than the region (the display region) that includes a plurality of pixels. Crystalline silicon TFTs using a polycrystalline silicon film as the active layer are used as TFTs (circuit TFTs) of the peripheral driver circuits, for example. By using oxide semiconductor TFTs as pixel TFTs and using crystalline silicon TFTs as circuit TFTs, it is possible to reduce the power consumption in the display region while also reducing the size of the bezel region.

Any of the TFTs described above with reference to FIG. 1 to FIG. 10 can be used as the pixel TFT. This will be discussed later.

Next, a more detailed configuration of the active matrix substrate of the present embodiment will be described with reference to the drawings.

Figure 11:
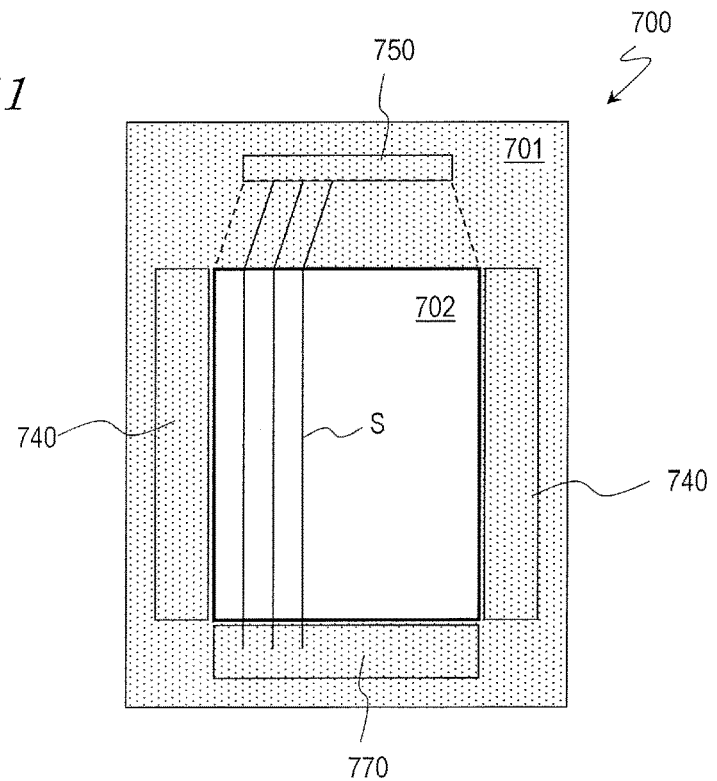
FIG. 11 A schematic plan view showing an example of a structure as seen from above of an active matrix substrate 700 of the fourth embodiment.
Figure 12:
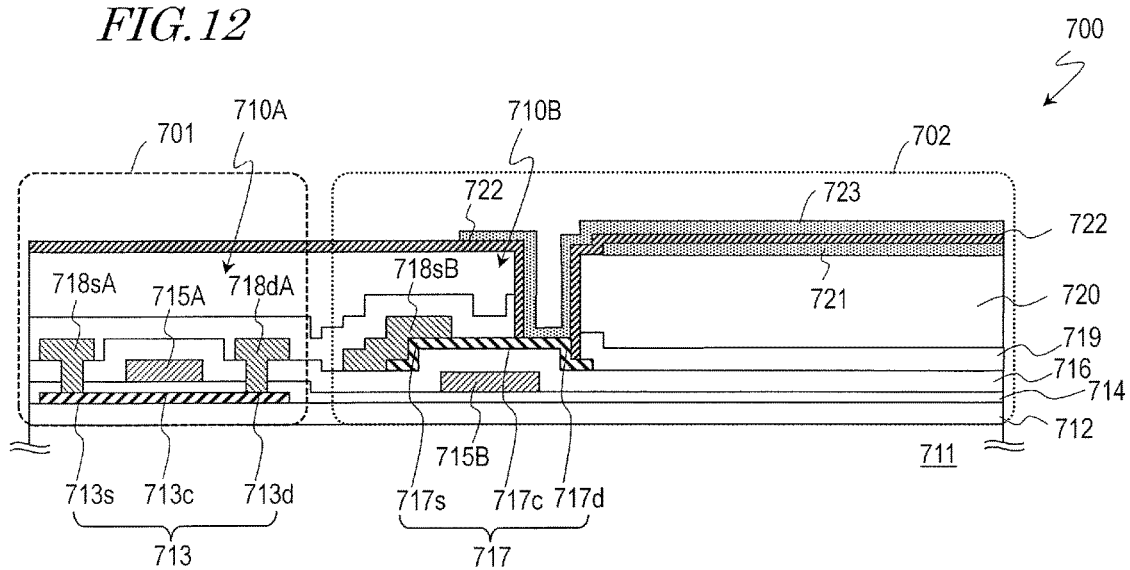
FIG. 12 A cross-sectional view showing a crystalline silicon TFT 710A and an oxide semiconductor TFT 710B of the active matrix substrate 700.

FIG. 11 is a schematic plan view showing an example of a structure as seen from above of the active matrix substrate 700 of the present embodiment, and FIG. 12 is a cross-sectional view showing a cross-sectional structure of crystalline silicon TFT (hereinafter referred to as a "first thin film transistor") 710A and an oxide semiconductor TFT (hereinafter referred to as a "second thin film transistor") 710B of the active matrix substrate 700.

As shown in FIG. 11, the active matrix substrate 700 has a display region 702 including a plurality of pixels, and a region (non-display region) other than the display region 702. The non-display region includes a driver circuit formation region 701 where driver circuits are provided. For example, a gate driver circuit 740, a test circuit 770, etc., are provided in the driver circuit formation region 701. A plurality of gate bus lines (not shown) extending in the row direction and a plurality of source bus lines S extending in the column direction are formed in the display region 702. Although not shown in the figures, each pixel is defined by a gate bus line and a source bus line S, for example. The gate bus lines are connected respectively to terminals of the gate driver circuit. The source bus lines S are connected respectively to terminals of a driver IC 750 mounted on the active matrix substrate 700.

As shown in FIG. 12, on the active matrix substrate 700, a second thin film transistor 710B is formed as a pixel TFT in each pixel of the display region 702, and a first thin film transistor 710A is formed as a circuit TFT in the driver circuit formation region 701.

The active matrix substrate 700 includes a substrate 711, a base film 712 formed on the surface of the substrate 711, the first thin film transistor 710A formed on the base film 712, and the second thin film transistor 710B formed on the base film 712. The first thin film transistor 710A is a crystalline silicon TFT having an active region that primarily includes crystalline silicon. The second thin film transistor 710B is an oxide semiconductor TFT having an active region that primarily includes an oxide semiconductor. The first thin film transistor 710A and the second thin film transistor 710B are built integral with the substrate 711. An "active region" as used herein refers to a region, where the channel is formed, of a semiconductor layer to be the active layer of the TFT.

The first thin film transistor 710A includes a crystalline silicon semiconductor layer (e.g., a low-temperature polysilicon layer) 713 formed on the base film 712, a first insulating layer 714 covering the crystalline silicon semiconductor layer 713, and a gate electrode 715A provided on the first insulating layer 714. A portion of the first insulating layer 714 that is located between the crystalline silicon semiconductor layer 713 and a gate electrode 715A functions as the gate insulating film of the first thin film transistor 710A. The crystalline silicon semiconductor layer 713 includes a region (active region) 713*c* where the channel is formed, and a source region 713*s* and a drain region 713*d* that are located on opposite sides of the active region. In this example, a portion of the crystalline silicon semiconductor layer 713 that overlaps the gate electrode 715A with the first insulating layer 714 therebetween serves as the active region 713*c*. The first thin film transistor 710A also includes a source electrode 718*s*A and a drain electrode 718*d*A that are connected to the source region 713*s* and the drain region 713*d*, respectively. The source and drain electrodes 718*s*A and 718*d*A may be formed on an interlayer insulating film (here, a second insulating layer 716) that covers the gate electrode 715A and the crystalline silicon semiconductor layer 713, and may be connected to the crystalline silicon semiconductor layer 713 in the contact holes formed in the interlayer insulating film.

The second thin film transistor 710B includes a gate electrode 715B provided on the base film 712, the second insulating layer 716 covering the gate electrode 715B, and an oxide semiconductor layer 717 arranged on the second insulating layer 716. As shown in the figure, the first insulating layer 714, which is the gate insulating film of the first thin film transistor 710A, may be provided to extend to a region where the second thin film transistor 710B is to be formed. In such a case, the oxide semiconductor layer 717 may be formed on the first insulating layer 714. A portion of the second insulating layer 716 that is located between a gate electrode 715B and the oxide semiconductor layer 717 functions as the gate insulating film of the second thin film transistor 710B. The oxide semiconductor layer 717 includes a region (active region) 717c where the channel is formed, and a source contact region 717s and a drain contact region 717d located on opposite sides of the active region. In this example, a portion of the oxide semiconductor layer 717 that overlaps the gate electrode 715B with the second insulating layer 716 therebetween serves as the active region 717c. The second thin film transistor 710B further includes a source electrode 718sB connected to the source contact region 717s. The drain contact region 717d is directly connected to a pixel electrode 723. Note that alternatively, the base film 712 may be absent on the substrate 711.

The thin film transistors 710A and 710B are covered by a passivation film 719 and a flattening film 720. In the second thin film transistor 710B, which functions as the pixel TFT, the gate electrode 715B is connected to a gate bus line (not shown) and the source electrode 718sB to a source bus line (not shown). In this example, the pixel electrode 723 is connected to the drain contact region 717d in the opening formed in the passivation film 719 and the flattening film 720. A video signal is supplied to the source electrode 718sB via the source bus line, and an electric charge is written as necessary to the pixel electrode 723 based on the gate signal from the gate bus line.

Note that as shown in the figure, a transparent conductive layer 721 may be formed as a common electrode on the flattening film 720, and a third insulating layer 722 may be formed between the transparent conductive layer (common electrode) 721 and the pixel electrode 723. In this case, a slit-shaped opening may be provided in the pixel electrode 723. Such an active matrix substrate 700 is applicable to display devices of an FFS (Fringe Field Switching) mode, for example. The FFS mode is of a transverse electric field scheme in which a pair of electrodes are provided on one substrate, and an electric field is applied to liquid crystal molecules in a direction parallel to the substrate surface (the transverse direction). In this example, there is produced an electric field represented by lines of electric force that emerge from the pixel electrode 723, pass through the liquid crystal layer (not shown), and further extend to the common electrode 721 through the slit-shaped opening of the pixel electrode 723. This electric field has a component that is transverse with respect to the liquid crystal layer. As a result, it is possible to apply a transverse electric field through the liquid crystal layer. The transverse electric field scheme is advantageous in that liquid crystal molecules do not rise from the substrate, thereby realizing a wider viewing angle than the vertical electric field scheme.

Figure 3:
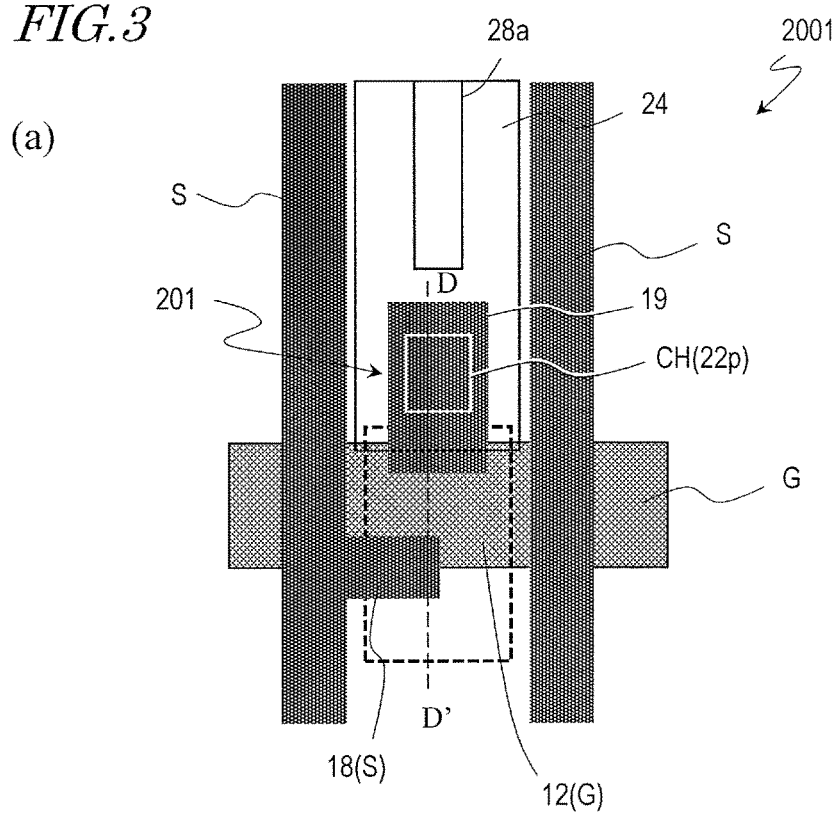
FIG. 3 (a) and (b) are a plan view and a cross-sectional view, respectively, showing a semiconductor device 2001 of Reference Example 1.
Figure 3:
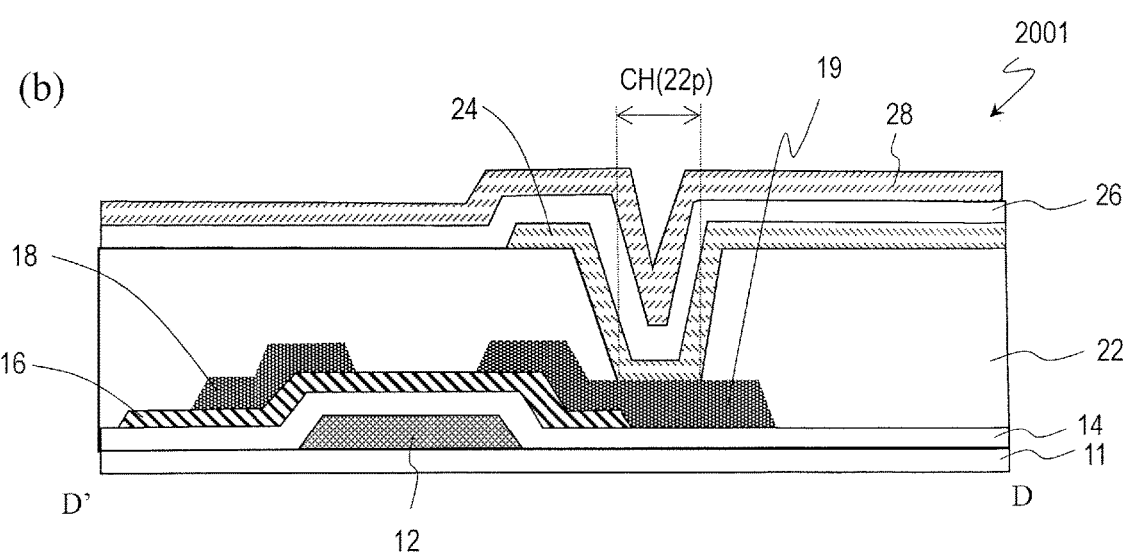

Any of the TFTs of the first to third embodiments described above with reference to FIGS. 1 to 10 may be used as the second thin film transistor 710B of the present embodiment. When the TFTs of FIG. 1 to FIG. 3 are used, the gate electrode 12, the gate insulating layer 14, the oxide semiconductor layer 16 and the source electrode 18 of the TFT may correspond respectively to the gate electrode 715B, the second insulating layer (gate insulating layer) 716, the oxide semiconductor layer 717 and the source electrode 718sB shown in FIG. 12.

The thin film transistor 710B, which is an oxide semiconductor TFT, may be used as TFTs of the test circuit 770 (test TFTs) shown in FIG. 11.

Note that although not shown in the figure, the test TFTs and the test circuit may be formed in the region where the driver IC 750 shown in FIG. 11 is mounted, for example. In this case, the test TFTs are arranged between the driver IC 750 and the substrate 711.

In the illustrated example, the first thin film transistor 710A has a top gate structure in which the crystalline silicon semiconductor layer 713 is arranged between the gate electrode 715A and the substrate 711 (the base film 712). On the other hand, the second thin film transistor 710B has a bottom gate structure in which the gate electrode 715B is arranged between the oxide semiconductor layer 717 and the substrate 711 (the base film 712). By employing such a structure, it is possible to more effectively suppress the increase in the number of manufacturing steps and the increase in the manufacturing cost when integrally forming two different thin film transistors 710A and 710B on the same substrate 711.

The TFT structures of the first thin film transistor 710A and the second thin film transistor 710B are not limited to those described above. For example, these thin film transistors 710A and 710B may have the same TFT structure. For example, the first thin film transistor 710A may have a bottom gate structure. For the bottom gate structure, it may be of the channel-etch type, as with the thin film transistor 710B, or it may be of the etch-stop type.

The second insulating layer 716, which is the gate insulating film of the second thin film transistor 710B, may be provided so as to extend to a region where the first thin film transistor 710A is formed, and may function as an interlayer insulating film that covers the gate electrode 715A and the crystalline silicon semiconductor layer 713 of the first thin film transistor 710A. When the interlayer insulating film of the first thin film transistor 710A and the gate insulating film of the second thin film transistor 710B are formed in the same layer (second insulating layer) 716, as described above, the second insulating layer 716 may have a layered structure. For example, the second insulating layer 716 may have a layered structure including a hydrogen-donating layer (e.g., a silicon nitride layer) that is capable of supplying hydrogen, and an oxygen-donating layer (e.g., a silicon oxide layer) capable of supplying oxygen, which is arranged on the hydrogen-donating layer.

The gate electrode 715A of the first thin film transistor 710A and the gate electrode 715B of the second thin film transistor 710B may be formed in the same layer. The source and drain electrodes 718sA and 718dA of the first thin film transistor 710A and the source electrode 718sB of the second thin film transistor 710B may be formed in the same layer. To be "formed in the same layer" means that they are formed by using the same film (conductive film). Then, it is possible to suppress the increase in the number of manufacturing steps and the increase in the manufacturing cost.

INDUSTRIAL APPLICABILITY

The embodiments of the present invention are widely applicable to various semiconductor devices including oxide semiconductor TFTs. For example, they are applied to circuit substrates such as active matrix substrates, display devices such as liquid crystal display devices, organic electroluminescence (EL) display devices, inorganic electroluminescence display devices and MEMS display devices, imaging devices such as image sensor devices, image input devices, fingerprint reader devices, and various electronic devices such as semiconductor memory devices. Particularly, they are suitably applied to high-definition liquid crystal display devices.

REFERENCE SIGNS LIST

11 Substrate
12 Gate electrode
14 Gate insulating layer
16 Oxide semiconductor layer
16c Channel region
16d Drain contact region
16s Source contact region
18 Source electrode
22 Interlayer insulating layer
22p, 26p, 31p Opening
24 Pixel electrode
26 Dielectric layer
28 Common electrode
101 Oxide semiconductor TFT
CH Contact hole
G Gate line
G1 Gate line main portion
G2 Gate line branch portion
S Source line
S1 Source line main portion
S2 Source line branch portion
R First drain contact portion
1001, 1002, 1003, 1004, 1005 Semiconductor device (TFT substrate)

The invention claimed is:

1. A semiconductor device comprising a substrate and a thin film transistor supported on the substrate,
the thin film transistor including:
a gate electrode;
a gate insulating layer covering the gate electrode;
an oxide semiconductor layer arranged on the gate insulating layer so as to partially overlap the gate electrode with the gate insulating layer therebetween, the oxide semiconductor layer including a channel region, and a source contact region and a drain contact region arranged on opposite sides of the channel region; and
a source electrode in contact with the source contact region of the oxide semiconductor layer,
the semiconductor device further comprising:
an insulating layer arranged so as to cover the oxide semiconductor layer, the insulating layer having a contact hole through which the drain contact region of the oxide semiconductor layer is exposed; and
a transparent electrode formed on the insulating layer and in the contact hole so as to be in contact with the drain contact region in the contact hole, wherein:
as seen from a direction normal to the substrate, at least a part of the drain contact region overlaps the gate electrode; and
on an arbitrary cross section that extends in a channel width direction of the thin film transistor across the at least part of the drain contact region, a width of the oxide semiconductor layer is greater than a width of the gate electrode, and the gate electrode is covered by the oxide semiconductor layer with the gate insulating layer therebetween.

2. The semiconductor device of claim 1, further comprising:
a plurality of pixels arranged on the substrate in a matrix pattern extending in a first direction and in a second direction, a plurality of gate lines extending in the first direction, and a plurality of source lines extending in the second direction, wherein:
the thin film transistor and the transparent electrode are arranged for each of the plurality of pixels; and
the gate electrode is connected to one of the plurality of gate lines, and the source electrode is connected to one of the plurality of source lines.

3. The semiconductor device of claim 2, wherein the source contact region, the channel region and the drain contact region are arranged next to each other in the second direction.

4. The semiconductor device of claim 2, wherein:
as seen from the direction normal to the substrate, each of the plurality of gate lines includes a gate line main portion extending in the first direction, and a gate line branch portion extending in the second direction from the gate line main portion; and
as seen from the direction normal to the substrate, at least a part of the gate line branch portion overlaps the drain contact region.

5. The semiconductor device of claim 4, wherein as seen from the direction normal to the substrate, the gate line branch portion includes a first portion that overlaps the drain contact region and a second portion located between the first portion and the gate line main portion, and a maximum width of the first portion in the channel width direction is smaller than a maximum width of the second portion in the channel width direction.

6. The semiconductor device of claim 5, wherein a width of the gate line branch portion in the channel width direction gradually decreases away from the gate line main portion.

7. The semiconductor device of claim 4, wherein as seen from the direction normal to the substrate, the oxide semiconductor layer is arranged so as to cover the gate line branch portion and extend across the gate line main portion.

8. The semiconductor device of claim 2, wherein as seen from the direction normal to the substrate, each of the plurality of source lines includes a source line main portion extending in the second direction and a source line branch portion extending in the first direction from the source line main portion, and at least a part of the source line branch portion is in contact with the source contact region.

9. The semiconductor device of claim 1, further comprising a dielectric layer formed on the transparent electrode and another transparent electrode formed on the dielectric layer.

10. The semiconductor device of claim 1, further comprising another transparent electrode arranged on a substrate side of the transparent electrode and a dielectric layer arranged between the other transparent electrode and the transparent electrode.

11. The semiconductor device of claim 1, wherein the thin film transistor has a channel-etch structure.

12. The semiconductor device of claim 1, wherein the oxide semiconductor layer includes an In—Ga—Zn—O-based oxide.

13. The semiconductor device of claim 12, wherein the In—Ga—Zn—O-based oxide includes a crystalline portion.

14. The semiconductor device of claim 1, wherein the oxide semiconductor layer has a layered structure.

15. A method for manufacturing a semiconductor device including a thin film transistor, the method comprising the steps of:
(a) forming a gate electrode on the substrate;
(b) forming a gate insulating layer covering the gate electrode;
(c) forming an oxide semiconductor film on the gate insulating layer and patterning the oxide semiconductor film, thereby obtaining an island-shaped oxide semiconductor layer that overlaps the gate electrode with the gate insulating layer therebetween;

(d) forming a source electrode in contact with the oxide semiconductor layer, a region of the oxide semiconductor layer that is in contact with the source electrode being a source contact region;

(e) forming an insulating layer covering the oxide semiconductor layer;

(f) forming a contact hole in the insulating layer through which a part of the oxide semiconductor layer is exposed; and (g) forming a transparent electrode on the insulating layer and in the contact hole so as to be in direct contact with the part of the oxide semiconductor layer in the contact hole, the part of the oxide semiconductor layer being a drain contact region, and a region of the oxide semiconductor layer that is located between the drain contact region and the source contact region serving as a channel region, wherein:

as seen from a direction normal to the substrate, at least a part of the drain contact region of the oxide semiconductor layer overlaps the gate electrode; and on an arbitrary cross section that extends in a channel width direction of the thin film transistor across the at least part of the drain contact region, a width of the oxide semiconductor layer is greater than a width of the gate electrode, and the gate electrode is covered by the oxide semiconductor layer with the gate insulating layer therebetween.

16. The method for manufacturing a semiconductor device of claim 15, wherein the thin film transistor has a channel-etch structure.

17. The method for manufacturing a semiconductor device of claim 15, wherein the oxide semiconductor layer includes an In—Ga—Zn—O-based oxide.

18. The method for manufacturing a semiconductor device of claim 17, wherein the In—Ga—Zn—O-based oxide includes a crystalline portion.

19. The method for manufacturing a semiconductor device of claim 15, wherein the oxide semiconductor layer has a layered structure.

* * * * *